United States Patent
Abotabl et al.

(10) Patent No.: US 12,349,179 B2
(45) Date of Patent: Jul. 1, 2025

(54) SYMBOL LEVEL INTERLEAVING IN FULL-DUPLEX SLOTS

(71) Applicant: QUALCOMM Incorporated, San Diego, CA (US)

(72) Inventors: Ahmed Attia Abotabl, San Diego, CA (US); Muhammad Sayed Khairy Abdelghaffar, San Jose, CA (US); Alexandros Manolakos, Escondido, CA (US); Seyedkianoush Hosseini, San Diego, CA (US); Gabi Sarkis, San Diego, CA (US); Yi Huang, San Diego, CA (US); Wanshi Chen, San Diego, CA (US); Krishna Kiran Mukkavilli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 269 days.

(21) Appl. No.: 17/996,494

(22) PCT Filed: May 11, 2021

(86) PCT No.: PCT/US2021/031864
§ 371 (c)(1),
(2) Date: Oct. 18, 2022

(87) PCT Pub. No.: WO2021/231492
PCT Pub. Date: Nov. 18, 2021

(65) Prior Publication Data
US 2023/0224942 A1 Jul. 13, 2023

(30) Foreign Application Priority Data
May 11, 2020 (GR) .............................. 20200100238

(51) Int. Cl.
*H04W 72/541* (2023.01)
*H04L 1/00* (2006.01)
(Continued)

(52) U.S. Cl.
CPC ......... *H04W 72/541* (2023.01); *H04L 1/0071* (2013.01); *H04L 5/0023* (2013.01);
(Continued)

(58) Field of Classification Search
CPC .............. H04W 72/541; H04W 72/062; H04L 1/0071; H04L 1/0041; H04L 5/0023;
(Continued)

(56) References Cited

U.S. PATENT DOCUMENTS 8,305,943 B2    11/2012  Khandekar et al.
2021/0058219 A1*  2/2021  Kimura ..................... H04L 5/14

FOREIGN PATENT DOCUMENTS

CN    110022194 A       7/2019
JP    2003169378 A  *   6/2003
(Continued)

OTHER PUBLICATIONS

3GPP TS 36.306: "3rd Generation Partnership Project; Technical Specification Group Radio Access Network; Evolved Universal Terrestrial Radio Access (E-UTRA); User Equipment (UE) Radio Access Capabilities (Release 16)", 3GPP Standard, Technical Specification, 3GPP TS 36.306, V16.0.0 (Mar. 2020), 3rd Generation Partnership Project, Mobile Competence Centre, 650, Route Des Lucioles, F-06921 Sophia-Antipolis Cedex, France, vol. RAN WG2, No. V16.0.0, Apr. 8, 2020, pp. 1-128, XP051893878, Section 7.7.2.
(Continued)

*Primary Examiner* — Jianye Wu
(74) *Attorney, Agent, or Firm* — Norton Rose Fulbright US LLP

(57) ABSTRACT

In one aspect, a method of wireless communication includes determining, by a user equipment (UE), one or more full-
(Continued)

duplex symbols of a slot and one or more half-duplex symbols of the slot; determining, by the UE, to use a first type of interleaving for the one or more full-duplex symbols and a second type of interleaving for the one or more half-duplex symbols; frequency domain mapping, by the UE, virtual resources of the slot to physical resources of the slot based on the first type of interleaving and the second type of interleaving; and communicating, by the UE, based on the physical resources. Other aspects and features are also claimed and described.

30 Claims, 18 Drawing Sheets

(51) Int. Cl.
*H04L 5/00* (2006.01)
*H04L 5/14* (2006.01)
*H04L 5/16* (2006.01)

(52) U.S. Cl.
CPC .......... *H04L 5/0035* (2013.01); *H04L 5/1461* (2013.01); *H04L 5/16* (2013.01)

(58) Field of Classification Search
CPC ....... H04L 5/0035; H04L 5/1461; H04L 5/16; H04L 5/0073; H04L 5/0091; H04L 5/001; H04L 5/1469; H04L 5/14; H04M 13/27
See application file for complete search history.

(56) References Cited

FOREIGN PATENT DOCUMENTS

WO  WO-2007137191     11/2007
WO  WO-2019142524 A1   7/2019

OTHER PUBLICATIONS

International Search Report and Written Opinion—PCT/US2021/031864—ISA/EPO—Aug. 13, 2021 (204262WO).

* cited by examiner

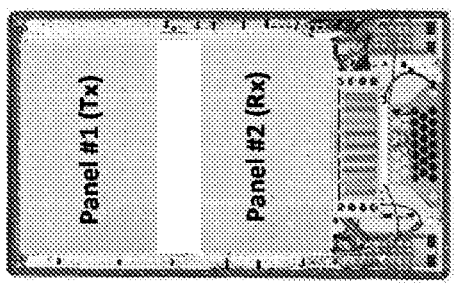
FIG. 8A
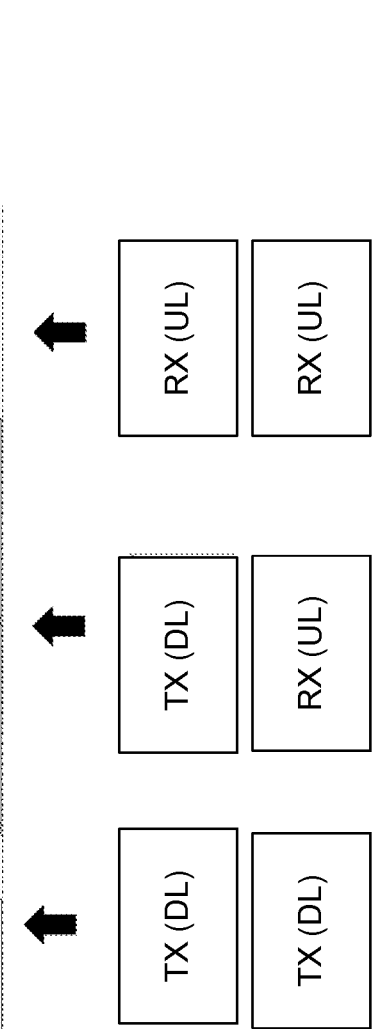
FIG. 8B
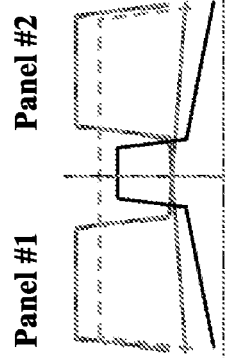
FIG. 8D
FIG. 8C

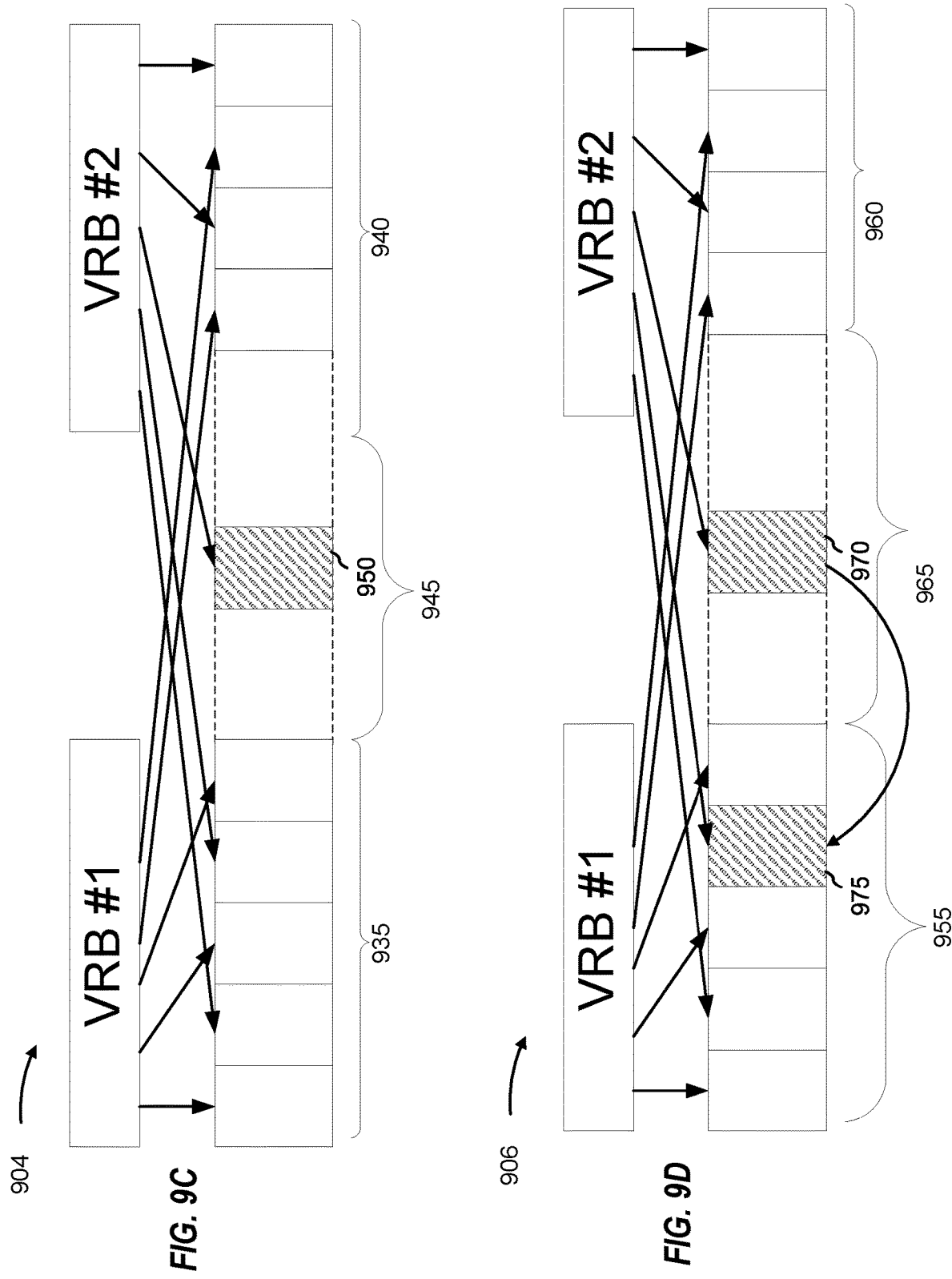

SYMBOL LEVEL INTERLEAVING IN FULL-DUPLEX SLOTS

CROSS-REFERENCE TO RELATED APPLICATIONS

This application claims the benefit of International Patent Application No. PCT/US2021/031864, entitled, "SYMBOL LEVEL INTERLEAVING IN FULL-DUPLEX SLOTS," filed on May 11, 2021, and also the benefit of Greece Patent Application Serial No. 20200100238, entitled "SYMBOL LEVEL INTERLEAVING IN FULL-DUPLEX SLOTS," filed, May 11, 2020, both of which are expressly incorporated by reference herein in their entirety.

TECHNICAL FIELD

Aspects of the present disclosure relate generally to wireless communication systems, and more particularly, to full-duplex operations. Certain embodiments of the technology discussed below can enable and provide enhanced symbol interleaving for full-duplex operations.

INTRODUCTION

Wireless communication networks are widely deployed to provide various communication services such as voice, video, packet data, messaging, broadcast, and the like. These wireless networks may be multiple-access networks capable of supporting multiple users by sharing the available network resources. Such networks, which are usually multiple access networks, support communications for multiple users by sharing the available network resources.

A wireless communication network may include a number of base stations or node Bs that can support communication for a number of user equipments (UEs). A UE may communicate with a base station via downlink and uplink. The downlink (or forward link) refers to the communication link from the base station to the UE, and the uplink (or reverse link) refers to the communication link from the UE to the base station.

A base station may transmit data and control information on the downlink to a UE and/or may receive data and control information on the uplink from the UE. On the downlink, a transmission from the base station may encounter interference due to transmissions from neighbor base stations or from other wireless radio frequency (RF) transmitters. On the uplink, a transmission from the UE may encounter interference from uplink transmissions of other UEs communicating with the neighbor base stations or from other wireless RF transmitters. This interference may degrade performance on both the downlink and uplink.

As the demand for mobile broadband access continues to increase, the possibilities of interference and congested networks grows with more UEs accessing the long-range wireless communication networks and more short-range wireless systems being deployed in communities. Research and development continue to advance wireless technologies not only to meet the growing demand for mobile broadband access, but to advance and enhance the user experience with mobile communications.

BRIEF SUMMARY OF SOME EMBODIMENTS

The following summarizes some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

In one aspect of the disclosure, a method of wireless communication includes determining, by a user equipment (UE), one or more full-duplex symbols of a slot and one or more half-duplex symbols of the slot; determining, by the UE, to use a first type of interleaving for the one or more full-duplex symbols and a second type of interleaving for the one or more half-duplex symbols; frequency domain mapping, by the UE, virtual resources of the slot to physical resources of the slot based on the first type of interleaving and the second type of interleaving; and communicating, by the UE, based on the physical resources.

In an additional aspect of the disclosure, apparatus configured for wireless communication is disclosed. The apparatus includes means for determining, by a user equipment (UE), one or more full-duplex symbols of a slot and one or more half-duplex symbols of the slot; means for determining, by the UE, to use a first type of interleaving for the one or more full-duplex symbols and a second type of interleaving for the one or more half-duplex symbols; means for frequency domain mapping, by the UE, virtual resources of the slot to physical resources of the slot based on the first type of interleaving and the second type of interleaving; and means for communicating, by the UE, based on the physical resources.

In an additional aspect of the disclosure, a non-transitory computer-readable medium having program code recorded thereon. The program code further includes code to determine, by a user equipment (UE), one or more full-duplex symbols of a slot and one or more half-duplex symbols of the slot; determine, by the UE, to use a first type of interleaving for the one or more full-duplex symbols and a second type of interleaving for the one or more half-duplex symbols; frequency domain map, by the UE, virtual resources of the slot to physical resources of the slot based on the first type of interleaving and the second type of interleaving; and communicate, by the UE, based on the physical resources.

In an additional aspect of the disclosure, an apparatus configured for wireless communication is disclosed. The apparatus includes at least one processor, and a memory coupled to the processor. The processor is configured to determine, by a user equipment (UE), one or more full-duplex symbols of a slot and one or more half-duplex symbols of the slot; determine, by the UE, to use a first type of interleaving for the one or more full-duplex symbols and a second type of interleaving for the one or more half-duplex symbols; frequency domain map, by the UE, virtual resources of the slot to physical resources of the slot based on the first type of interleaving and the second type of interleaving; and communicate, by the UE, based on the physical resources.

In an additional aspect of the disclosure, a method of wireless communication includes receiving, by a user equipment (UE), a configured grant determining, by the UE, to use full-duplex symbol interleaving for each UL grant associated with the configured grant; generating, by the UE, an uplink transmission based on the full-duplex symbol interleaving; and transmitting, by the UE, the uplink transmission during a particular UL grant of the UL grants associated with the configured grant.

In an additional aspect of the disclosure, a method of wireless communication includes determining, by a user equipment (UE), one or more full-duplex symbols of a slot and one or more half-duplex symbols of the slot; determining, by the UE, to use a first type of interleaving for the one or more full-duplex symbols; transmitting and receiving, by the UE, data based on the first type of interleaving for the one or more full-duplex symbols.

In an additional aspect of the disclosure, a method of wireless communication includes determining, by a network entity, one or more full-duplex symbols of a slot and one or more half-duplex symbols of the slot; determining, by the network entity, to use a first type of interleaving for the one or more full-duplex symbols and a second type of interleaving for the one or more half-duplex symbols; frequency domain mapping, by the network entity, virtual resources of the slot to physical resources of the slot based on the first type of interleaving and the second type of interleaving; and communicating, by the network entity, based on the physical resources.

In an additional aspect of the disclosure, a method of wireless communication includes transmitting, by a network entity, a configured grant to a user equipment (UE); determining, by the network entity, to use full-duplex symbol interleaving for each UL grant associated with the configured grant; receiving, by the network entity, an uplink transmission during a particular UL grant of the UL grants associated with the configured grant; and processing, by the UE, the uplink transmission based on the full-duplex symbol interleaving.

In an additional aspect of the disclosure, a method of wireless communication includes determining, by a network entity, one or more full-duplex symbols of a slot and one or more half-duplex symbols of the slot; determining, by the network entity, to use a first type of interleaving for the one or more full-duplex symbols; transmitting and/or receiving, by the network entity, data based on the first type of interleaving for the one or more full-duplex symbols.

Other aspects, features, and embodiments will become apparent to those of ordinary skill in the art, upon reviewing the following description of specific, exemplary embodiments in conjunction with the accompanying figures. While features may be discussed relative to certain embodiments and figures below, all embodiments can include one or more of the advantageous features discussed herein. In other words, while one or more embodiments may be discussed as having certain advantageous features, one or more of such features may also be used in accordance with the various embodiments. In similar fashion, while exemplary embodiments may be discussed below as device, system, or method embodiments the exemplary embodiments can be implemented in various devices, systems, and methods.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

FIG. 8A is a diagram of an example antenna layout.

FIG. 8B is a diagram of an example timing diagram.

FIG. 8C is a diagram illustrating antenna operations for the antenna layout of FIG. 8A during the timing diagram of FIG. 8B.

FIG. 8D is a diagram illustrating antenna leakage for the antenna layout of FIG. 8A during the timing diagram of FIG. 8B.

FIGS. 9A-9E are each a diagram illustrating an example of a particular type of symbol level interleaving.

DETAILED DESCRIPTION

Figure 1:
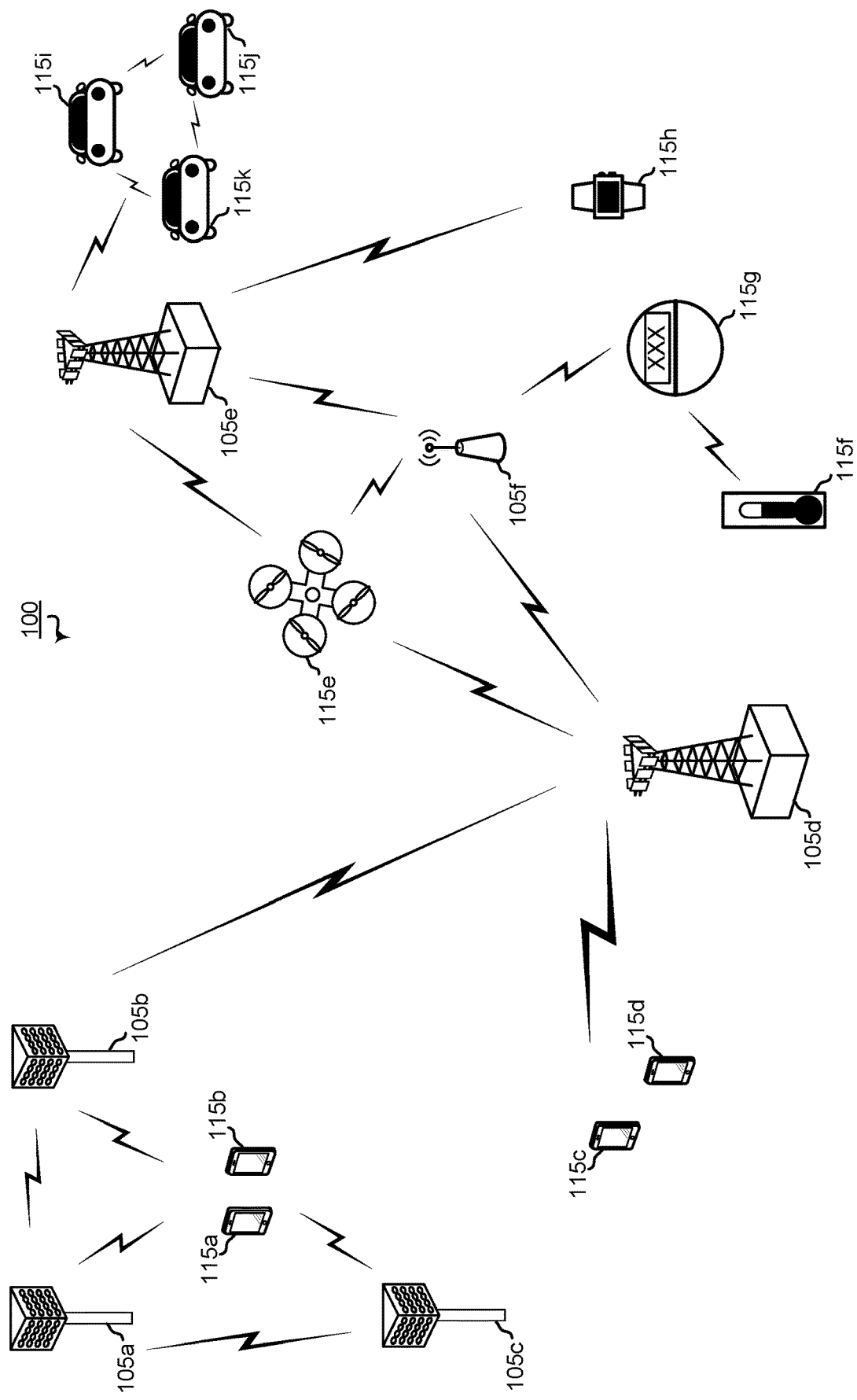
FIG. 1 is a block diagram illustrating details of a wireless communication system according to some embodiments of the present disclosure.

The detailed description set forth below, in connection with the appended drawings, is intended as a description of various configurations and is not intended to limit the scope of the disclosure. Rather, the detailed description includes specific details for the purpose of providing a thorough understanding of the inventive subject matter. It will be apparent to those skilled in the art that these specific details are not required in every case and that, in some instances, well-known structures and components are shown in block diagram form for clarity of presentation.

The present disclosure is related to symbol level interleaving schemes and operations for full-duplex wireless communications. Conventionally, full-duplex wireless communications specifications are in development and no interleaving and/or virtual resource block to physical resource block mapping is currently used. Full-duplex modes are quite diverse and can result in full-duplex slots that operate similar to half-duplex slots. For example, a portion of the full-duplex slot may operate in half-duplex and both full- and half-duplex operations may be performed on a per sub-slot/symbol basis. To illustrate, one or more sub-slots or symbols of a slot may involve the UE receiving or transmitting only, and may not involve receiving and transmitting in the same sub-slots or symbols. When some types of conventional and/or single interleaving operations are used for full-duplex operation, full-duplex symbols, such interleaving operations may not fully take advantage of interleaving gain and thus, may reduce potential performance when used for half-duplex operations/symbols. Thus, network performance can be enhanced by improved determination and/or selection of symbol level interleaving for full-duplex modes.

The described techniques relate to improved methods, systems, devices, and apparatuses that support symbol level interleaving for full-duplex modes. A user equipment (UE) and base station (e.g., gNB) may determine a type of symbol (e.g., full-duplex or half-duplex) for each symbol of a slot and then determine a particular type of symbol level interleaving based on the types of symbols of the slot. In some implementations, the UE and base station may determine one type of interleaving based on the type of symbols. In other implementations, the UE and base station may determine one type of interleaving for a first type of symbols and another type of interleaving for a second type of symbols. Additionally or alternatively, the UE and gNB may determine to use a particular type of interleaving when symbol type cannot be determined. For example, when using configured grants or semi-persistent scheduling one node may not be able to know or predict symbol type and may revert or defaults to a particular type of interleaving, such as a particular type of full-duplex interleaving.

The UE and the base station may then operate in full-duplex modes and use one or more types of interleaving that provide a reduction in interference, such as self-interference. Accordingly, such techniques may increase signal-to-noise rations and thus, reliability and throughput when operating in full-duplex communication modes.

This disclosure relates generally to providing or participating in communication as between two or more wireless devices in one or more wireless communications systems, also referred to as wireless communications networks. In various embodiments, the techniques and apparatus may be used for wireless communication networks such as code division multiple access (CDMA) networks, time division multiple access (TDMA) networks, frequency division multiple access (FDMA) networks, orthogonal FDMA (OFDMA) networks, single-carrier FDMA (SC-FDMA) networks, LTE networks, GSM networks, $5^{th}$ Generation (5G) or new radio (NR) networks (sometimes referred to as "5G NR" networks/systems/devices), as well as other communications networks. As described herein, the terms "networks" and "systems" may be used interchangeably.

A CDMA network, for example, may implement a radio technology such as universal terrestrial radio access (UTRA), cdma2000, and the like. UTRA includes wideband-CDMA (W-CDMA) and low chip rate (LCR). CDMA2000 covers IS-2000, IS-95, and IS-856 standards.

A TDMA network may, for example implement a radio technology such as GSM. 3GPP defines standards for the GSM EDGE (enhanced data rates for GSM evolution) radio access network (RAN), also denoted as GERAN. GERAN is the radio component of GSM/EDGE, together with the network that joins the base stations (for example, the Ater and Abis interfaces) and the base station controllers (A interfaces, etc.). The radio access network represents a component of a GSM network, through which phone calls and packet data are routed from and to the public switched telephone network (PSTN) and Internet to and from subscriber handsets, also known as user terminals or user equipments (UEs). A mobile phone operator's network may comprise one or more GERANs, which may be coupled with Universal Terrestrial Radio Access Networks (UTRANs) in the case of a UMTS/GSM network. An operator network may also include one or more LTE networks, and/or one or more other networks. The various different network types may use different radio access technologies (RATs) and radio access networks (RANs).

An OFDMA network may implement a radio technology such as evolved UTRA (E-UTRA), IEEE 802.11, IEEE 802.16, IEEE 802.20, flash-OFDM and the like. UTRA, E-UTRA, and Global System for Mobile Communications (GSM) are part of universal mobile telecommunication system (UMTS). In particular, long term evolution (LTE) is a release of UMTS that uses E-UTRA. UTRA, E-UTRA, GSM, UMTS and LTE are described in documents provided from an organization named "3rd Generation Partnership Project" (3GPP), and cdma2000 is described in documents from an organization named "3rd Generation Partnership Project 2" (3GPP2). These various radio technologies and standards are known or are being developed. For example, the 3rd Generation Partnership Project (3GPP) is a collaboration between groups of telecommunications associations that aims to define a globally applicable third generation (3G) mobile phone specification. 3GPP long term evolution (LTE) is a 3GPP project which was aimed at improving the universal mobile telecommunications system (UMTS) mobile phone standard. The 3GPP may define specifications for the next generation of mobile networks, mobile systems, and mobile devices. The present disclosure is concerned with the evolution of wireless technologies from LTE, 4G, 5G, NR, and beyond with shared access to wireless spectrum between networks using a collection of new and different radio access technologies or radio air interfaces.

5G networks contemplate diverse deployments, diverse spectrum, and diverse services and devices that may be implemented using an OFDM-based unified, air interface. To achieve these goals, further enhancements to LTE and LTE-A are considered in addition to development of the new radio technology for 5G NR networks. The 5G NR will be capable of scaling to provide coverage (1) to a massive Internet of things (IoTs) with an ultra-high density (e.g., ~1M nodes/km²), ultra-low complexity (e.g., ~10s of bits/sec), ultra-low energy (e.g., ~10+ years of battery life), and deep coverage with the capability to reach challenging locations; (2) including mission-critical control with strong security to safeguard sensitive personal, financial, or classified information, ultra-high reliability (e.g., ~99.9999% reliability), ultra-low latency (e.g., ~1 ms), and users with wide ranges of mobility or lack thereof; and (3) with enhanced mobile broadband including extreme high capacity (e.g., ~10 Tbps/km$^2$), extreme data rates (e.g., multi-Gbps rate, 100+ Mbps user experienced rates), and deep awareness with advanced discovery and optimizations.

5G NR devices, networks, and systems may be implemented to use optimized OFDM-based waveform features. These features may include scalable numerology and transmission time intervals (TTIs); a common, flexible framework to efficiently multiplex services and features with a dynamic, low-latency time division duplex (TDD)/frequency division duplex (FDD) design; and advanced wireless technologies, such as massive multiple input, multiple output (MIMO), robust millimeter wave (mmWave) transmissions, advanced channel coding, and device-centric mobility. Scalability of the numerology in 5G NR, with scaling of subcarrier spacing, may efficiently address operating diverse services across diverse spectrum and diverse deployments. For example, in various outdoor and macro coverage deployments of less than 3GHz FDD/TDD implementations, subcarrier spacing may occur with 15 kHz, for example over 1, 5, 10, 20 MHz, and the like bandwidth. For other various outdoor and small cell coverage deployments of TDD greater than 3 GHz, subcarrier spacing may occur with 30 kHz over 80/100 MHz bandwidth. For other various indoor wideband implementations, using a TDD over the unlicensed portion of the 5 GHz band, the subcarrier spacing may occur with 60 kHz over a 160 MHz bandwidth. Finally, for various deployments transmitting with mmWave components at a TDD of 28 GHz, subcarrier spacing may occur with 120 kHz over a 500 MHz bandwidth.

The scalable numerology of 5G NR facilitates scalable TTI for diverse latency and quality of service (QoS) requirements. For example, shorter TTI may be used for low latency and high reliability, while longer TTI may be used for higher spectral efficiency. The efficient multiplexing of long and short TTIs to allow transmissions to start on symbol boundaries. 5G NR also contemplates a self-contained integrated subframe design with uplink/downlink scheduling information, data, and acknowledgement in the same subframe. The self-contained integrated subframe supports communications in unlicensed or contention-based shared spectrum, adaptive uplink/downlink that may be flexibly configured on a per-cell basis to dynamically switch between uplink and downlink to meet the current traffic needs.

For clarity, certain aspects of the apparatus and techniques may be described below with reference to exemplary LTE implementations or in an LTE-centric way, and LTE terminology may be used as illustrative examples in portions of the description below; however, the description is not intended to be limited to LTE applications. Indeed, the present disclosure is concerned with shared access to wireless spectrum between networks using different radio access technologies or radio air interfaces, such as those of 5G NR.

Moreover, it should be understood that, in operation, wireless communication networks adapted according to the concepts herein may operate with any combination of licensed or unlicensed spectrum depending on loading and availability. Accordingly, it will be apparent to one of skill in the art that the systems, apparatus and methods described herein may be applied to other communications systems and applications than the particular examples provided.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and/or other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range from chip-level or modular components to non-modular, non-chip-level implementations and further to aggregated, distributed, or OEM devices or systems incorporating one or more described aspects. In some practical settings, devices incorporating described aspects and features may also necessarily include additional components and features for implementation and practice of claimed and described embodiments. It is intended that innovations described herein may be practiced in a wide variety of implementations, including both large/small devices, chip-level components, multi-component systems (e.g. RF-chain, communication interface, processor), distributed arrangements, end-user devices, etc. of varying sizes, shapes, and constitution.

FIG. 1 shows wireless network 100 for communication according to some embodiments. Wireless network 100 may, for example, comprise a 5G wireless network. As appreciated by those skilled in the art, components appearing in FIG. 1 are likely to have related counterparts in other network arrangements including, for example, cellular-style network arrangements and non-cellular-style-network arrangements (e.g., device to device or peer to peer or ad hoc network arrangements, etc.).

Wireless network 100 illustrated in FIG. 1 includes a number of base stations 105 and other network entities. A base station may be a station that communicates with the UEs and may also be referred to as an evolved node B (eNB), a next generation eNB (gNB), an access point, and the like. Each base station 105 may provide communication coverage for a particular geographic area. In 3GPP, the term "cell" can refer to this particular geographic coverage area of a base station and/or a base station subsystem serving the coverage area, depending on the context in which the term is used. In implementations of wireless network 100 herein, base stations 105 may be associated with a same operator or different operators (e.g., wireless network 100 may comprise a plurality of operator wireless networks), and may provide wireless communications using one or more of the same frequencies (e.g., one or more frequency bands in licensed spectrum, unlicensed spectrum, or a combination thereof) as a neighboring cell. In some examples, an individual base station 105 or UE 115 may be operated by more than one network operating entity. In other examples, each base station 105 and UE 115 may be operated by a single network operating entity.

A base station may provide communication coverage for a macro cell or a small cell, such as a pico cell or a femto cell, and/or other types of cell. A macro cell generally covers a relatively large geographic area (e.g., several kilometers in radius) and may allow unrestricted access by UEs with service subscriptions with the network provider. A small cell, such as a pico cell, would generally cover a relatively smaller geographic area and may allow unrestricted access by UEs with service subscriptions with the network provider. A small cell, such as a femto cell, would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). A base station for a macro cell may be referred to as a macro base station. A base station for a small cell may be referred to as a small cell base station, a pico base station, a femto base station or a home base station. In the example shown in FIG. 1, base stations 105d and 105e are regular macro base stations, while base stations 105a-105c are macro base stations enabled with one of 3 dimension (3D), full dimension (FD), or massive MIMO. Base stations 105a-105c take advantage of their higher dimension MIMO capabilities to exploit 3D beamforming in both elevation and azimuth beamforming to increase coverage and capacity. Base station 105f is a small cell base station which may be a home node or portable access point. A base station may support one or multiple (e.g., two, three, four, and the like) cells.

Wireless network 100 may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. In some scenarios, networks may be enabled or configured to handle dynamic switching between synchronous or asynchronous operations.

UEs 115 are dispersed throughout the wireless network 100, and each UE may be stationary or mobile. It should be appreciated that, although a mobile apparatus is commonly referred to as user equipment (UE) in standards and specifications promulgated by the 3rd Generation Partnership Project (3GPP), such apparatus may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, a gaming device, an augmented reality device, vehicular component device/module, or some other suitable terminology. Within the present document, a "mobile" apparatus or UE need not necessarily have a capability to move, and may be stationary. Some non-limiting examples of a mobile apparatus, such as may comprise embodiments of one or more of UEs 115, include a mobile, a cellular (cell) phone, a smart phone, a session initiation protocol (SIP) phone, a wireless local loop (WLL) station, a laptop, a personal computer (PC), a notebook, a netbook, a smart book, a tablet, and a personal digital assistant (PDA). A mobile apparatus may additionally be an "Internet of things" (IoT) or "Internet of everything" (IoE) device such as an automotive or other transportation vehicle, a satellite radio, a global positioning system (GPS) device, a logistics controller, a drone, a multi-copter, a quad-copter, a smart energy or security device, a solar panel or solar array, municipal lighting, water, or other infrastructure; industrial automation and enterprise devices; consumer and wearable devices, such as eyewear, a wearable camera, a smart watch, a health or fitness tracker, a mammal implantable device, gesture tracking device, medical device, a digital audio player (e.g., MP3 player), a camera, a game console, etc.; and digital home or smart home devices such as a home audio, video, and multimedia device, an appliance, a sensor, a vending machine, intelligent lighting, a home security system, a smart meter, etc. In one aspect, a UE may be a device that includes a Universal Integrated Circuit Card (UICC). In another aspect, a UE may be a device that does not include a UICC. In some aspects, UEs that do not include UICCs may also be referred to as IoE devices. UEs 115a-115d of the embodiment illustrated in FIG. 1 are examples of mobile smart phone-type devices accessing wireless network 100 A UE may also be a machine specifically configured for connected communication, including machine type communication (MTC), enhanced MTC (eMTC), narrowband IoT (NB-IoT) and the like. UEs 115e-115k illustrated in FIG. 1 are examples of various machines configured for communication that access wireless network 100.

A mobile apparatus, such as UEs 115, may be able to communicate with any type of the base stations, whether macro base stations, pico base stations, femto base stations, relays, and the like. In FIG. 1, a lightning bolt (e.g., communication link) indicates wireless transmissions between a UE and a serving base station, which is a base station designated to serve the UE on the downlink and/or uplink, or desired transmission between base stations, and backhaul transmissions between base stations. UEs may operate as base stations or other network nodes in some scenarios. Backhaul communication between base stations of wireless network 100 may occur using wired and/or wireless communication links.

In operation at wireless network 100, base stations 105a-105c serve UEs 115a and 115b using 3D beamforming and coordinated spatial techniques, such as coordinated multi-point (CoMP) or multi-connectivity. Macro base station 105d performs backhaul communications with base stations 105a-105c, as well as small cell, base station 105f. Macro base station 105d also transmits multicast services which are subscribed to and received by UEs 115c and 115d. Such multicast services may include mobile television or stream video, or may include other services for providing community information, such as weather emergencies or alerts, such as Amber alerts or gray alerts.

Wireless network 100 of embodiments supports mission critical communications with ultra-reliable and redundant links for mission critical devices, such UE 115e, which is a drone. Redundant communication links with UE 115e include from macro base stations 105d and 105e, as well as small cell base station 105f. Other machine type devices, such as UE 115f (thermometer), UE 115g (smart meter), and UE 115h (wearable device) may communicate through wireless network 100 either directly with base stations, such as small cell base station 105f, and macro base station 105e, or in multi-hop configurations by communicating with another user device which relays its information to the network, such as UE 115f communicating temperature measurement information to the smart meter, UE 115g, which is then reported to the network through small cell base station 105f. Wireless network 100 may also provide additional network efficiency through dynamic, low-latency TDD/FDD communications, such as in a vehicle-to-vehicle (V2V) mesh network between UEs 115i-115k communicating with macro base station 105e.

Figure 2:
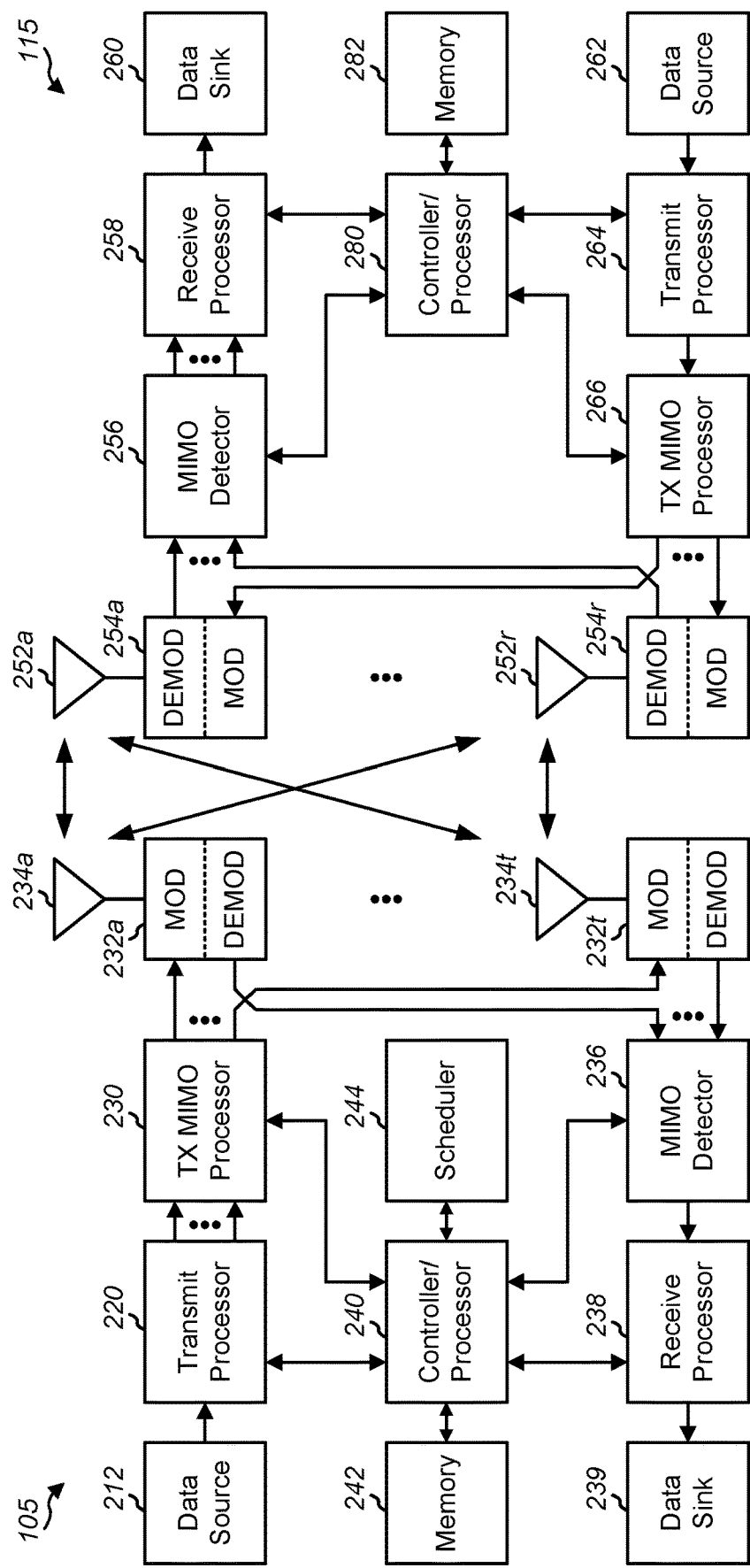
FIG. 2 is a block diagram conceptually illustrating a design of a base station and a UE configured according to some embodiments of the present disclosure.

FIG. 2 shows a block diagram of a design of a base station 105 and a UE 115, which may be any of the base stations and one of the UEs in FIG. 1. For a restricted association scenario (as mentioned above), base station 105 may be small cell base station 105f in FIG. 1, and UE 115 may be UE 115c or 115D operating in a service area of base station 105f, which in order to access small cell base station 105f, would be included in a list of accessible UEs for small cell base station 105f. Base station 105 may also be a base station of some other type. As shown in FIG. 2, base station 105 may be equipped with antennas 234a through 234t, and UE 115 may be equipped with antennas 252a through 252r for facilitating wireless communications.

At base station 105, transmit processor 220 may receive data from data source 212 and control information from controller/processor 240. The control information may be for the physical broadcast channel (PBCH), physical control format indicator channel (PCFICH), physical hybrid-ARQ (automatic repeat request) indicator channel (PHICH), physical downlink control channel (PDCCH), enhanced physical downlink control channel (EPDCCH), MTC physical downlink control channel (MPDCCH), etc. The data may be for the PDSCH, etc. Transmit processor 220 may process (e.g., encode and symbol map) the data and control information to obtain data symbols and control symbols, respectively. Transmit processor 220 may also generate reference symbols, e.g., for the primary synchronization signal (PSS) and secondary synchronization signal (SSS), and cell-specific reference signal. Transmit (TX) multiple-input multiple-output (MIMO) processor 230 may perform spatial processing (e.g., precoding) on the data symbols, the control symbols, and/or the reference symbols, if applicable, and may provide output symbol streams to modulators (MODs) 232a through 232t. Each modulator 232 may process a respective output symbol stream (e.g., for OFDM, etc.) to obtain an output sample stream. Each modulator 232 may additionally or alternatively process (e.g., convert to analog, amplify, filter, and upconvert) the output sample stream to obtain a downlink signal. Downlink signals from modulators 232a through 232t may be transmitted via antennas 234a through 234t, respectively.

At UE 115, the antennas 252a through 252r may receive the downlink signals from base station 105 and may provide received signals to demodulators (DEMODs) 254a through 254r, respectively. Each demodulator 254 may condition (e.g., filter, amplify, downconvert, and digitize) a respective received signal to obtain input samples. Each demodulator 254 may further process the input samples (e.g., for OFDM, etc.) to obtain received symbols. MIMO detector 256 may obtain received symbols from demodulators 254a through 254r, perform MIMO detection on the received symbols if applicable, and provide detected symbols. Receive processor 258 may process (e.g., demodulate, deinterleave, and decode) the detected symbols, provide decoded data for UE 115 to data sink 260, and provide decoded control information to controller/processor 280.

On the uplink, at UE 115, transmit processor 264 may receive and process data (e.g., for the physical uplink shared channel (PUSCH)) from data source 262 and control information (e.g., for the physical uplink control channel (PUCCH)) from controller/processor 280. Transmit processor 264 may also generate reference symbols for a reference signal. The symbols from transmit processor 264 may be precoded by TX MIMO processor 266 if applicable, further processed by modulators 254a through 254r (e.g., for SC-FDM, etc.), and transmitted to base station 105. At base station 105, the uplink signals from UE 115 may be received by antennas 234, processed by demodulators 232, detected by MIMO detector 236 if applicable, and further processed by receive processor 238 to obtain decoded data and control information sent by UE 115. Processor 238 may provide the decoded data to data sink 239 and the decoded control information to controller/processor 240.

Controllers/processors 240 and 280 may direct the operation at base station 105 and UE 115, respectively. Controller/processor 240 and/or other processors and modules at base station 105 and/or controller/processor 280 and/or other processors and modules at UE 115 may perform or direct the execution of various processes for the techniques described herein, such as to perform or direct the execution illustrated in FIGS. 10-13, and/or other processes for the techniques described herein. Memories 242 and 282 may store data and program codes for base station 105 and UE 115, respectively. Scheduler 244 may schedule UEs for data transmission on the downlink and/or uplink.

Wireless communications systems operated by different network operating entities (e.g., network operators) may share spectrum. In some instances, a network operating entity may be configured to use an entirety of a designated shared spectrum for at least a period of time before another network operating entity uses the entirety of the designated shared spectrum for a different period of time. Thus, in order to allow network operating entities use of the full designated shared spectrum, and in order to mitigate interfering communications between the different network operating entities, certain resources (e.g., time) may be partitioned and allocated to the different network operating entities for certain types of communication.

For example, a network operating entity may be allocated certain time resources reserved for exclusive communication by the network operating entity using the entirety of the shared spectrum. The network operating entity may also be allocated other time resources where the entity is given priority over other network operating entities to communicate using the shared spectrum. These time resources, prioritized for use by the network operating entity, may be utilized by other network operating entities on an opportunistic basis if the prioritized network operating entity does not utilize the resources. Additional time resources may be allocated for any network operator to use on an opportunistic basis.

Access to the shared spectrum and the arbitration of time resources among different network operating entities may be centrally controlled by a separate entity, autonomously determined by a predefined arbitration scheme, or dynamically determined based on interactions between wireless nodes of the network operators.

In some cases, UE 115 and base station 105 may operate in a shared radio frequency spectrum band, which may include licensed or unlicensed (e.g., contention-based) frequency spectrum. In an unlicensed frequency portion of the shared radio frequency spectrum band, UEs 115 or base stations 105 may traditionally perform a medium-sensing procedure to contend for access to the frequency spectrum. For example, UE 115 or base station 105 may perform a listen before talk (LBT) procedure such as a clear channel assessment (CCA) prior to communicating in order to determine whether the shared channel is available. A CCA may include an energy detection procedure to determine whether there are any other active transmissions. For example, a device may infer that a change in a received signal strength indicator (RSSI) of a power meter indicates that a channel is occupied. Specifically, signal power that is concentrated in a certain bandwidth and exceeds a predetermined noise floor may indicate another wireless transmitter. A CCA also may include detection of specific sequences that indicate use of the channel. For example, another device may transmit a specific preamble prior to transmitting a data sequence. In some cases, an LBT procedure may include a wireless node adjusting its own backoff window based on the amount of energy detected on a channel and/or the acknowledge/negative-acknowledge (ACK/NACK) feedback for its own transmitted packets as a proxy for collisions.

Figure 3A:
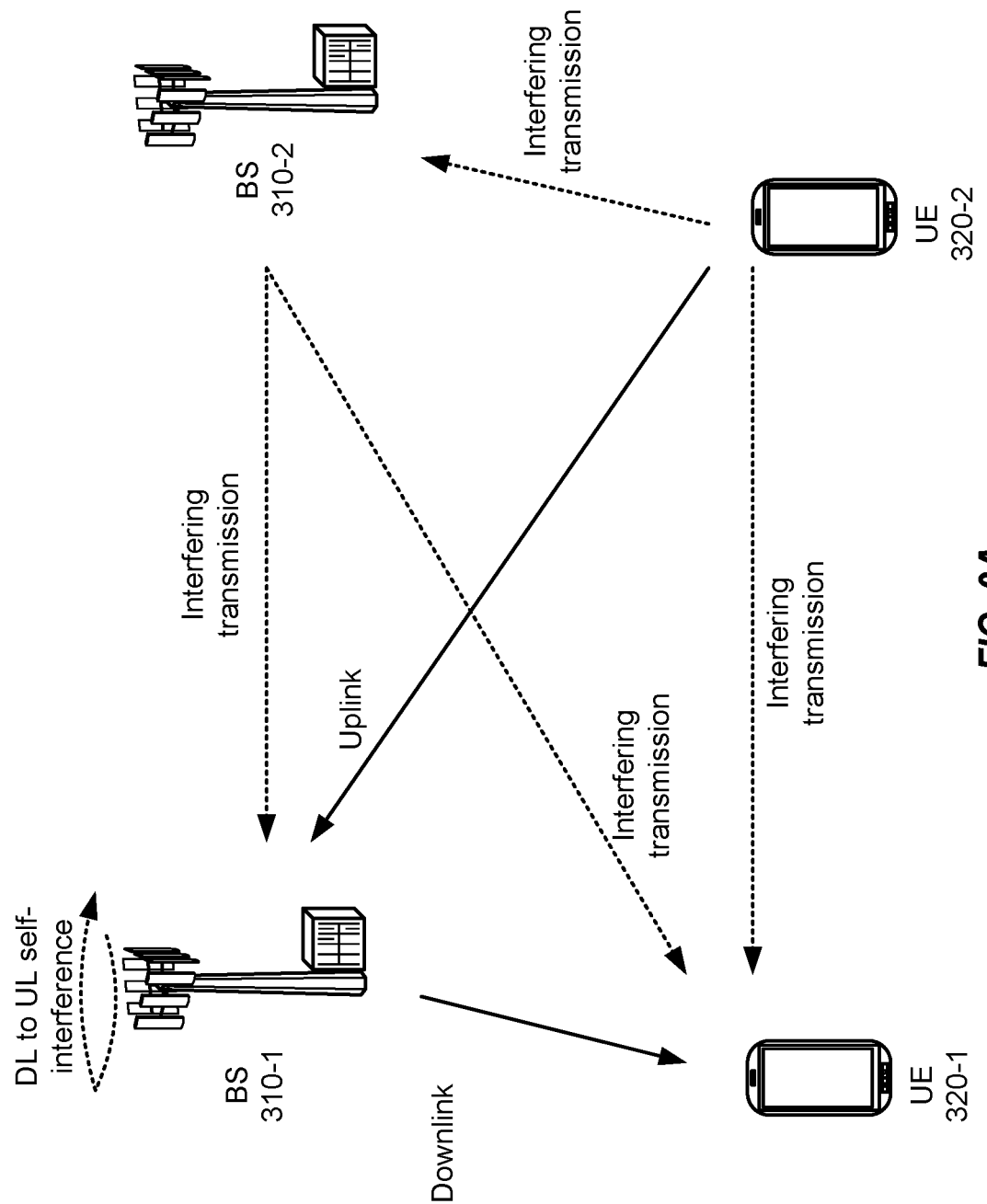
FIG. 3A is a diagram of a first example of full-duplex operations.
Figure 3B:
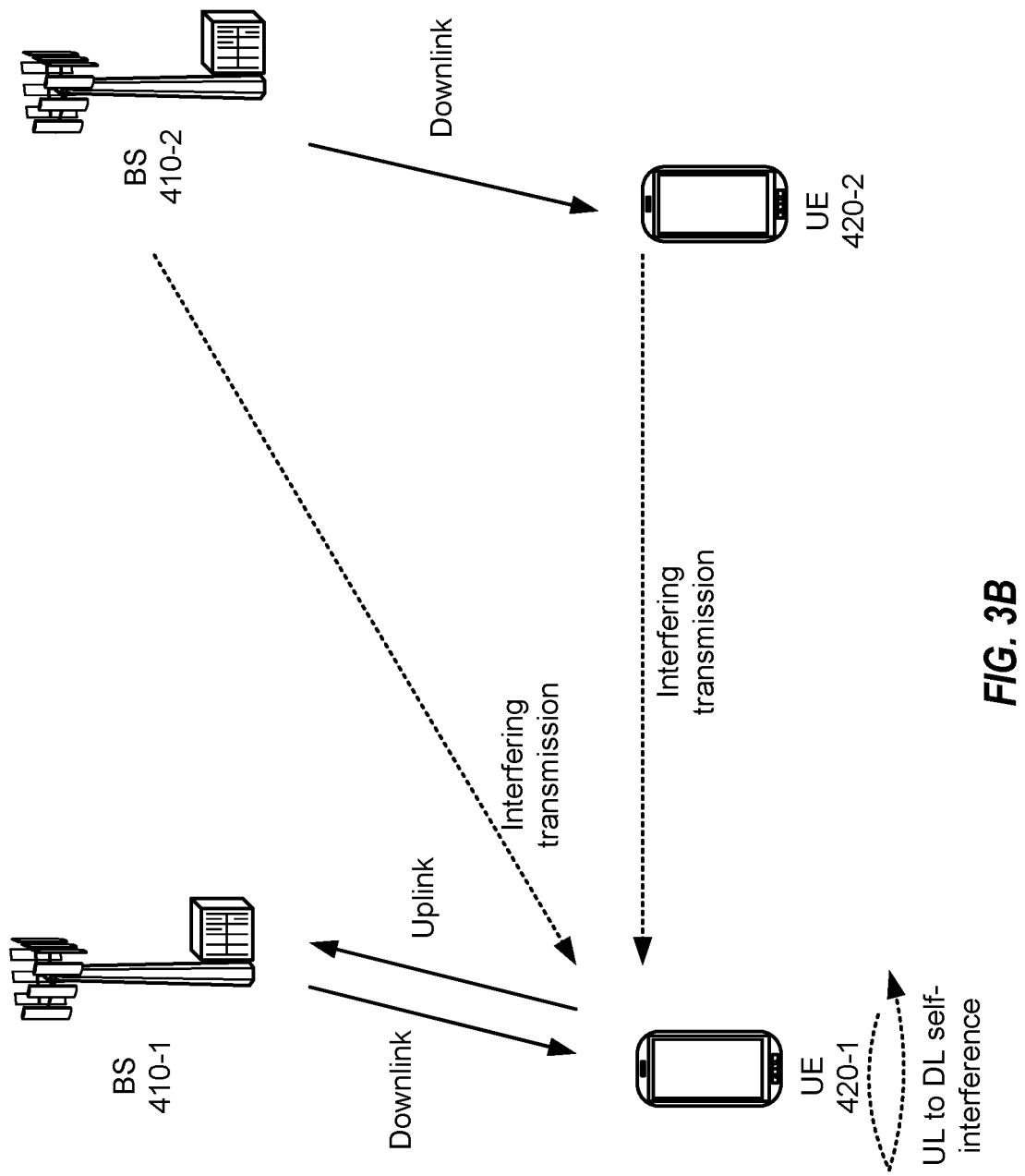
FIG. 3B is a diagram of a second example of full-duplex operations.
Figure 3C:
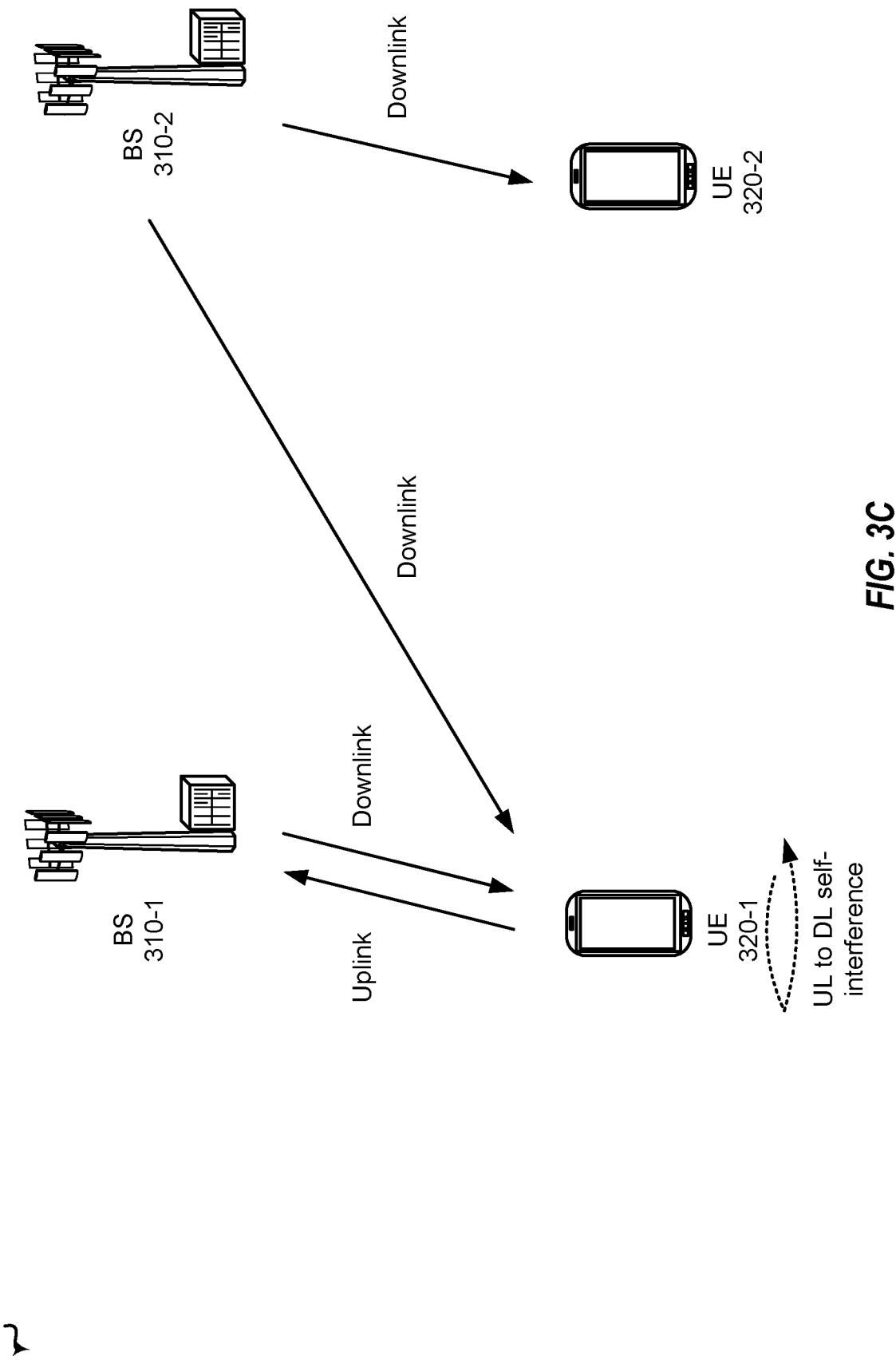
FIG. 3C is a diagram of a third example of full-duplex operations.

FIGS. 3A, 3B, and 3C illustrate examples of full-duplex communication modes. In FIG. 3A, full-duplex base station and half-duplex UE operations are shown, in FIG. 3B, full-duplex base station and full-duplex UE operations are shown, and in FIG. 3C, full-duplex UE operations with multiple TRPs are shown. Full-duplex operation corresponds to transmitting and/or receiving data via multiple antennas at the same time. Half-duplex operation corresponds to transmitting or receiving data via a single antenna at a particular time.

FIGS. 3A, 3B, and 3C depict interference caused from full-duplex operations. To illustrate, external interference and self-interference may be caused during full-duplex operations. External interference is caused from external sources, such as a from a nearby UE or base station. Self-interference is caused by the device. Self-interference may be caused by leakage, such as when transmitting energy from a transmitting antenna is received by receiving antenna directly or indirectly (e.g., by reflection).

In FIGS. 3A, 3B, and 3C, multiple TRPs are illustrated, such as a first TRP (TRP1) and a second TRP (TRP2). The first and second TRPs may include or correspond to the same base station, such as the same gNB, or to different base stations. In FIGS. 3A, 3B, and 3C, the first TRP (TRP1) may be operating in the same frequency band or in different frequency bands. For example, the first TRP (TRP1) may be operating in a first frequency band, such as FR 4 or 60 GHz, and the second TRP (TRP2) may be operating in a second frequency band, such as FR 2 or 28 GHz.

Additionally, multiple UEs are illustrated in FIGS. 3A, 3B, and 3C, such as a first UE (UE1) and a second UE (UE2) In some implementations, the UE is a full-duplex capable UE with multiple antenna module. FIGS. 3A, 3B, and 3C further depict signal paths between the TRPs and the UES.

Referring to FIG. 3A, FIG. 3A illustrates an example diagram 300 for a first type of full-duplex communication. Referring to FIG. 3A, the diagram 300 illustrates two signal paths (beam paths) between the TRPs and the UEs and example interference. In the example illustrated in FIG. 3A, the first TRP (TRP1) transmits downlink data via a first signal path to the first UE (UE1) and the first TRP (TRP2) receives uplink data via a second signal path from the second UE (UE2). The first TRP and UE experience interference. For example, the first TRP experiences self-interference from simultaneously transmitting and receiving. Additionally, devices receive interference caused by other nearby devices. For example, operations of the second TRP 2 may cause interference at all other nodes, such as the first UE and first TRP as illustrated in FIG. 3A. Additionally, the transmission of uplink data by the second UE may cause interference at the second TRP.

Referring to FIG. 3B, FIG. 3B illustrates an example diagram 310 for a second type of full-duplex communication. Referring to FIG. 3B, the diagram 310 illustrates two signal paths (beam paths) between the TRPs and the UEs and example interference. In the example illustrated in FIG. 3B, the first TRP (TRP1) transmits downlink data via a first signal path to the first UE (UE1) and the first TRP (TRP1) receives uplink data via a second signal path from the first UE (UE1). Additionally, the second TRP (TRP2) transmits downlink data via a third signal path to the second UE (UE2). The first TRP experiences interference. For example, the first TRP experiences self-interference from simultaneously transmitting and receiving and from the operations of the second TRP and UE. Additionally, other devices may receive interference caused by the operation other nearby devices, as described with reference to FIG. 3A.

Referring to FIG. 3C, FIG. 3C illustrates an example diagram 320 for a third type of full-duplex communication. Referring to FIG. 3C, the diagram 320 illustrates three signal paths (beam paths) between the TRPs and the UEs and example interference. In the example illustrated in FIG. 3C, the first TRP (TRP1) receives uplink data via a first signal path from the first UE (UE1), and the first TRP (TRP2) transmits downlink data via a second signal path to the first UE and via a third signal path the second UE. The first TRP may experience interference. For example, the first TRP experiences self-interference from simultaneously transmitting and receiving. Additionally, other devices may receive interference caused by the operation other nearby devices, as described with reference to FIG. 3A.

Figure 3F:
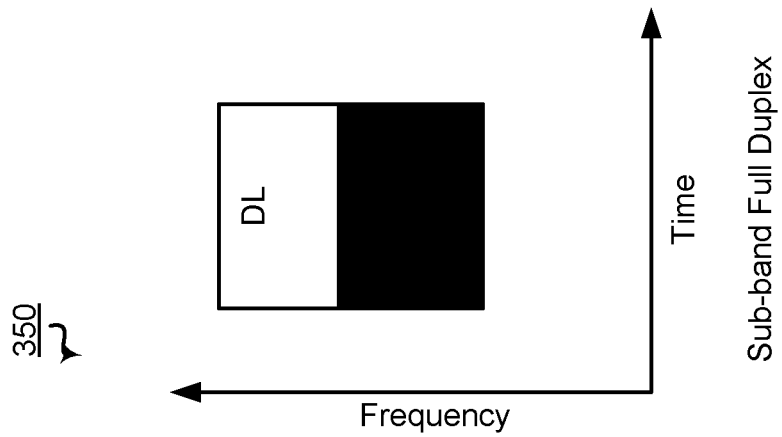
FIG. 3F is a diagram of a sixth example of full-duplex operations.
Figure 3E:
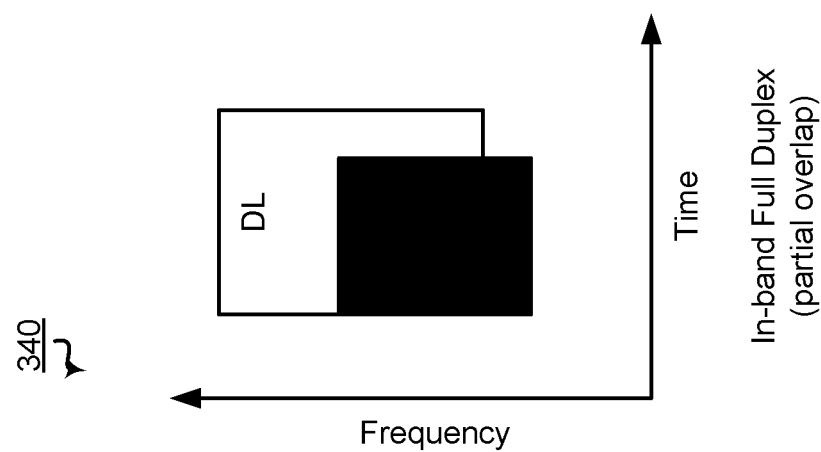
FIG. 3E is a diagram of a fifth example of full-duplex operations.
Figure 3D:
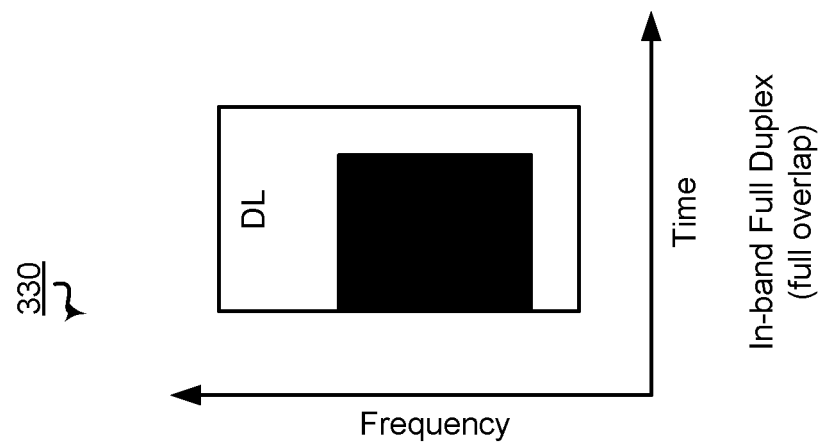
FIG. 3D is a diagram of a fourth example of full-duplex operations.

FIGS. 3D, 3E, and 3F illustrate examples of full-duplex communication operations. In FIGS. 3D and 3F, in-band full-duplex (IBFD) operations are shown, and in FIG. 3E sub-band full-duplex operations are shown. In-band full-duplex (IBFD) operation corresponds to transmitting and receiving on the same time and frequency resources. As showing in diagrams 330 and 340 of FIGS. 3D and 3E, the downlink and uplink resources share the same time and frequency resource. The downlink and uplink resources may fully or partially overlap, as shown in FIGS. 3D and 3E respectively. Sub-band full-duplex operation, often referred to as frequency division duplexing (FDD) or flexible duplex, corresponds to transmitting and receiving data at the same time but on different frequency resources. As shown in diagram 350 of FIG. 3F, the downlink resource is separate from the uplink resource by a relatively "thin" guard band. The guard band in FIG. 3F is enlarge for illustrative purposes. The guard band is what generally distinguishes SBFD from paired spectrum (e.g., IBFD) in current wireless standard specifications.

Figure 4:
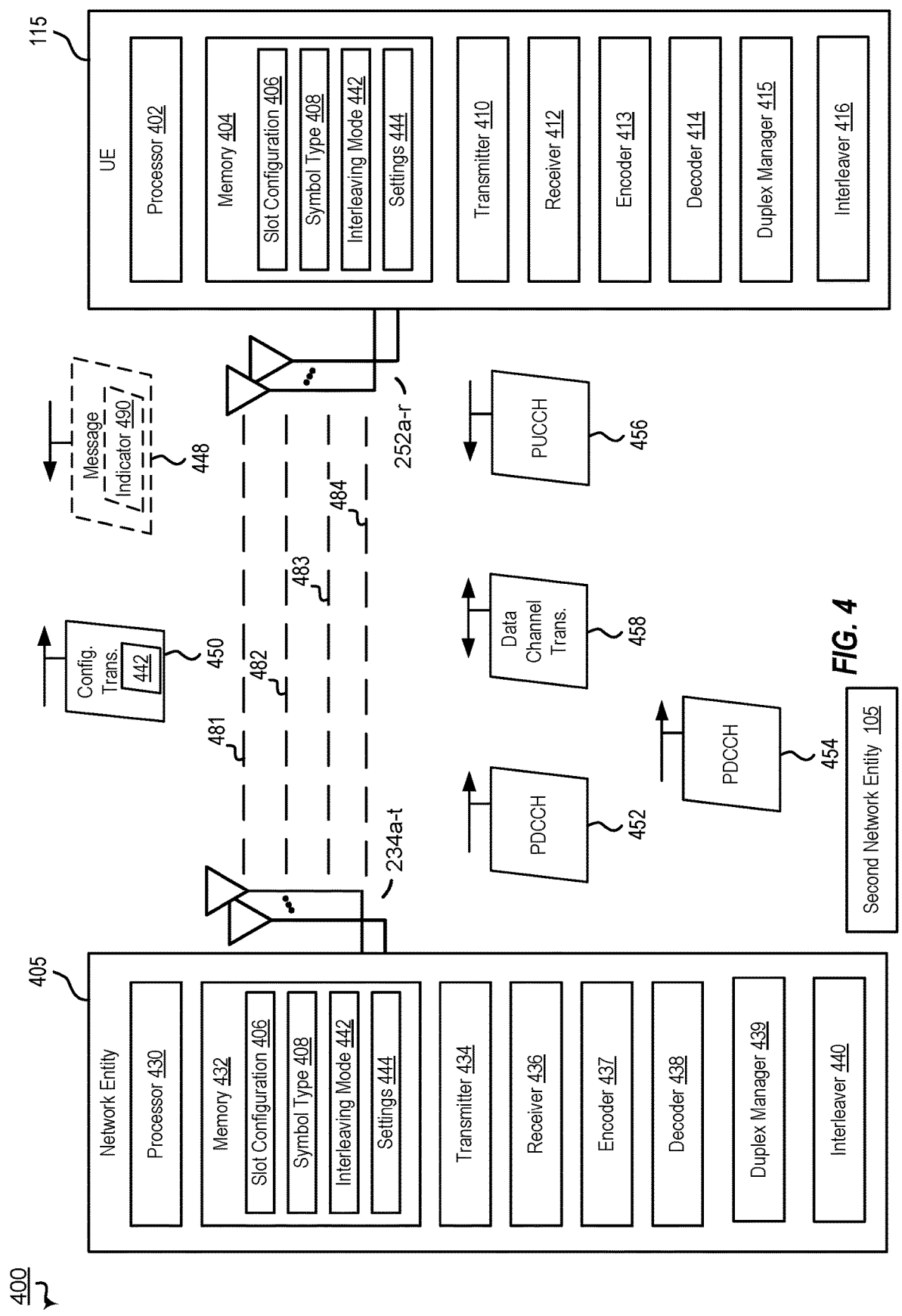
FIG. 4 is a block diagram illustrating an example of a wireless communications system (with a UE and base station) with symbol interleaving for full-duplex operations.

FIG. 4 illustrates an example of a wireless communications system 400 that supports symbol level interleaving in accordance with aspects of the present disclosure. In some examples, wireless communications system 400 may implement aspects of wireless communication system 100. For example, wireless communications system 400 may include UE 115 and network entity 405. Symbol level interleaving operations may increase throughput and reliability by reducing interference (e.g., self-interference). Thus, network and device performance can be increased.

Network entity 405 and UE 115 UE 115 may be configured to communicate via frequency bands, such as FR1 having a frequency of 410 to 7125 MHz, FR2 having a frequency of 24250 to 52600 MHz for mm-Wave, and/or one or more other frequency bands. It is noted that subcarrier spacing (SCS) may be equal to 15, 30, 60, or 120 kHz for some data channels. Network entity 405 and UE 115 may be configured to communicate via one or more component carriers (CCs), such as representative first CC 481, second CC 482, third CC 483, and fourth CC 484. Although four CCs are shown, this is for illustration only, more or fewer than four CCs may be used. One or more CCs may be used to communicate control channel transmissions, data channel transmissions, and/or sidelink channel transmissions.

Such transmissions may include a Physical Downlink Control Channel (PDCCH), a Physical Downlink Shared Channel (PDSCH), a Physical Uplink Control Channel (PUCCH), a Physical Uplink Shared Channel (PUSCH), a Physical Sidelink Control Channel (PSCCH), a Physical Sidelink Shared Channel (PSSCH), or a Physical Sidelink Feedback Channel (PSFCH). Such transmissions may be scheduled by aperiodic grants and/or periodic grants.

Each periodic grant may have a corresponding configuration, such as configuration parameters/settings. The periodic grant configuration may include configured grant (CG) configurations and settings. Additionally, or alternatively, one or more periodic grants (e.g., CGs thereof) may have or be assigned to a CC ID, such as intended CC ID.

Each CC may have a corresponding configuration, such as configuration parameters/settings. The configuration may include bandwidth, bandwidth part, HARQ process, TCI state, RS, control channel resources, data channel resources, or a combination thereof. Additionally, or alternatively, one or more CCs may have or be assigned to a Cell ID, a Bandwidth Part (BWP) ID, or both. The Cell ID may include a unique cell ID for the CC, a virtual Cell ID, or a particular Cell ID of a particular CC of the plurality of CCs. Additionally, or alternatively, one or more CCs may have or be assigned to a HARQ ID. Each CC may also have corresponding management functionalities, such as, beam management, BWP switching functionality, or both. In some implementations, two or more CCs are quasi co-located, such that the CCs have the same beam and/or same symbol.

In some implementations, control information may be communicated via network entity 405 and UE 115. For example, the control information may be communicated suing MAC-CE transmissions, RRC transmissions, DCI transmissions, another transmission, or a combination thereof.

UE 115 can include a variety of components (e.g., structural, hardware components) used for carrying out one or more functions described herein. For example, these components can includes processor 402, memory 404, transmitter 410, receiver 412, encoder, 413, decoder 414, duplex manager 415, interleaver 416 and antennas 252*a-r*. Processor 402 may be configured to execute instructions stored at memory 404 to perform the operations described herein. In some implementations, processor 402 includes or corresponds to controller/processor 280, and memory 404 includes or corresponds to memory 282. Memory 404 may also be configured to store slot configuration data 406, symbol type data 408, interleaving mode data 442, settings data 444, or a combination thereof, as further described herein.

The slot configuration data 406 includes or corresponds to data associated with or corresponding to slot configuration information. For example, the slot configuration data 406 may include a configuration of a particular slot or slot, such as DL symbols, UL symbols, guard bands, etc. In some implementations, the slot configuration data 406 may further include information or distinctions for IBFD and/or flexible duplex. The symbol type data 408 includes or corresponds to data indicating or corresponding to symbol type. For example, the symbol type may include or correspond to a half-duplex type symbols and full-duplex type symbols. In some implementations, the symbol type may further include information or distinctions for IBFD and/or flexible duplex. To illustrate, the symbol type data 408 may indicate full-duplex IBFD partial overlap, IBFD full overlap, or sub-band full-duplex.

The interleaving mode data 442 includes or corresponds to data that indicates a determined or selected interleaving mode. The interleaving mode data 442 may indicate a particular interleaving mode, such as full-duplex or half-duplex. The settings data 444 includes or corresponds to data associated with symbol level interleaving. The settings data 444 may include one or more type of interleaving modes and/or thresholds or conditions for selecting and/or implementing the interleaving modes.

Transmitter 410 is configured to transmit data to one or more other devices, and receiver 412 is configured to receive data from one or more other devices. For example, transmitter 410 may transmit data, and receiver 412 may receive data, via a network, such as a wired network, a wireless network, or a combination thereof. For example, UE 115 may be configured to transmit and/or receive data via a direct device-to-device connection, a local area network (LAN), a wide area network (WAN), a modem-to-modem connection, the Internet, intranet, extranet, cable transmission system, cellular communication network, any combination of the above, or any other communications network now known or later developed within which permits two or more electronic devices to communicate. In some implementations, transmitter 410 and receiver 412 may be replaced with a transceiver. Additionally, or alternatively, transmitter 410, receiver, 412, or both may include or correspond to one or more components of UE 115 described with reference to FIG. 2.

Encoder 413 and decoder 414 may be configured to encode and decode data for transmission. Duplex manager 415 may be configured to determine and perform duplex mode management and selection operations. For example, duplex manager 415 is configured to determine a duplex mode and slot type. To illustrate, duplex manager 415 may determine a slot type based on a downlink data or control transmission.

Interleaver 416 may be configured to determine to a particular interleaving mode. For example, interleaver 416 is configured to determine and/or select a particular interleaving mode. To illustrate, carrier aggregation unit 416 is configured to determine one or more symbol types of a slot and determine the interleaving mode based on the symbol types. The interleaver 416 may also be configured to apply the determined interleaving mode (e.g., interleave symbols).

Network entity 405 includes processor 430, memory 432, transmitter 434, receiver 436, encoder 437, decoder 438, duplex manager 439, interleaver 440, and antennas 234*a-t*. Processor 430 may be configured to execute instructions stores at memory 432 to perform the operations described herein. In some implementations, processor 430 includes or corresponds to controller/processor 240, and memory 432 includes or corresponds to memory 242. Memory 432 may be configured to store slot configuration data 406, symbol type data 408, interleaving mode data 442, settings data 444, or a combination thereof, similar to the UE 115 and as further described herein.

Transmitter 434 is configured to transmit data to one or more other devices, and receiver 436 is configured to receive data from one or more other devices. For example, transmitter 434 may transmit data, and receiver 436 may receive data, via a network, such as a wired network, a wireless network, or a combination thereof. For example, network entity 405 may be configured to transmit and/or receive data via a direct device-to-device connection, a local area network (LAN), a wide area network (WAN), a modem-to-modem connection, the Internet, intranet, extranet, cable transmission system, cellular communication network, any combination of the above, or any other communications network now known or later developed within which permits two or more electronic devices to communicate. In some implementations, transmitter 434 and receiver 436 may be replaced with a transceiver. Additionally, or alternatively, transmitter 434, receiver, 436, or both may include or correspond to one or more components of network entity 405 described with reference to FIG. 2.

Encoder 437, and decoder 438 may include the same functionality as described with reference to encoder 413 and decoder 414, respectively. Duplex manager 439 may include similar functionality as described with reference to duplex manager 415. Interleaver 440 may include similar functionality as described with reference to interleaver 416.

During operation of wireless communications system 400, network entity 405 may determine that UE 115 has symbol level interleaving capability. For example, UE 115 may transmit a message 448 that includes a symbol level interleaving indicator 490. Indicator 490 may indicate symbol level interleaving capability or a particular type or mode of symbol level interleaving. In some implementations, network entity 405 sends control information to indicate to UE 115 that symbol level interleaving and/or a particular type of symbol level interleaving is to be used. For example, in some implementations, message 448 (or another message, such as configuration transmission 450) is transmitted by the network entity 405. The configuration transmission 450 may include or indicate to use symbol level interleaving or to adjust or implement a setting of a particular type of symbol level interleaving.

During operation, devices of wireless communications system 400, perform symbol level interleaving. For example, a network entity (e.g., 405) may transmit a PDCCH transmission 452 to UE 115. Optionally, a second network entity (e.g., 405) may transmit a second PDCCH transmission 454 to UE 115.

After receiving the PDCCH transmissions 452, 454, the UE 115 may generate symbol type data 408. For example, the UE 115 may determine symbol types of symbols of a slot scheduled by the PDCCH transmissions 452, 454. To illustrate, the UE 115 may determine whether the symbols of the slot are full- or half-duplex.

The UE 115 determines interleaving mode data 442 based on the symbol type data 408. For example, the UE 115 may determine a particular interleaving mode for each symbol based on the symbol types of the symbols of the slot. The network entities may similarly may generate symbol type data 408 and determine interleaving mode data 442 based on the symbol type data 408.

The network entities and UE perform data channel transmissions 458 during the slots. For example, the network entity or entities transmit downlink data (e.g., DL symbols) and the UE 115 transmits uplink data (UL symbols). The UE 115 applies the interleaving mode indicated interleaving mode data 442 to the uplink data and the network entity or entities applies the interleaving mode indicated interleaving mode data 442 to the downlink data.

Accordingly, the UE 115 and network entities may be able to transmit and receive information with symbol level interleaving and reduced interference, such as reduced self-interference.

Accordingly, FIG. 4 describes enhanced interleaving operations for full-duplex operations. Using symbol level interleaving may enable improvement when operating in full-duplex modes. Performing symbol level interleaving enables reduced interference (e.g., self-interference) and thus, enhanced UE and network performance.

Figure 5:
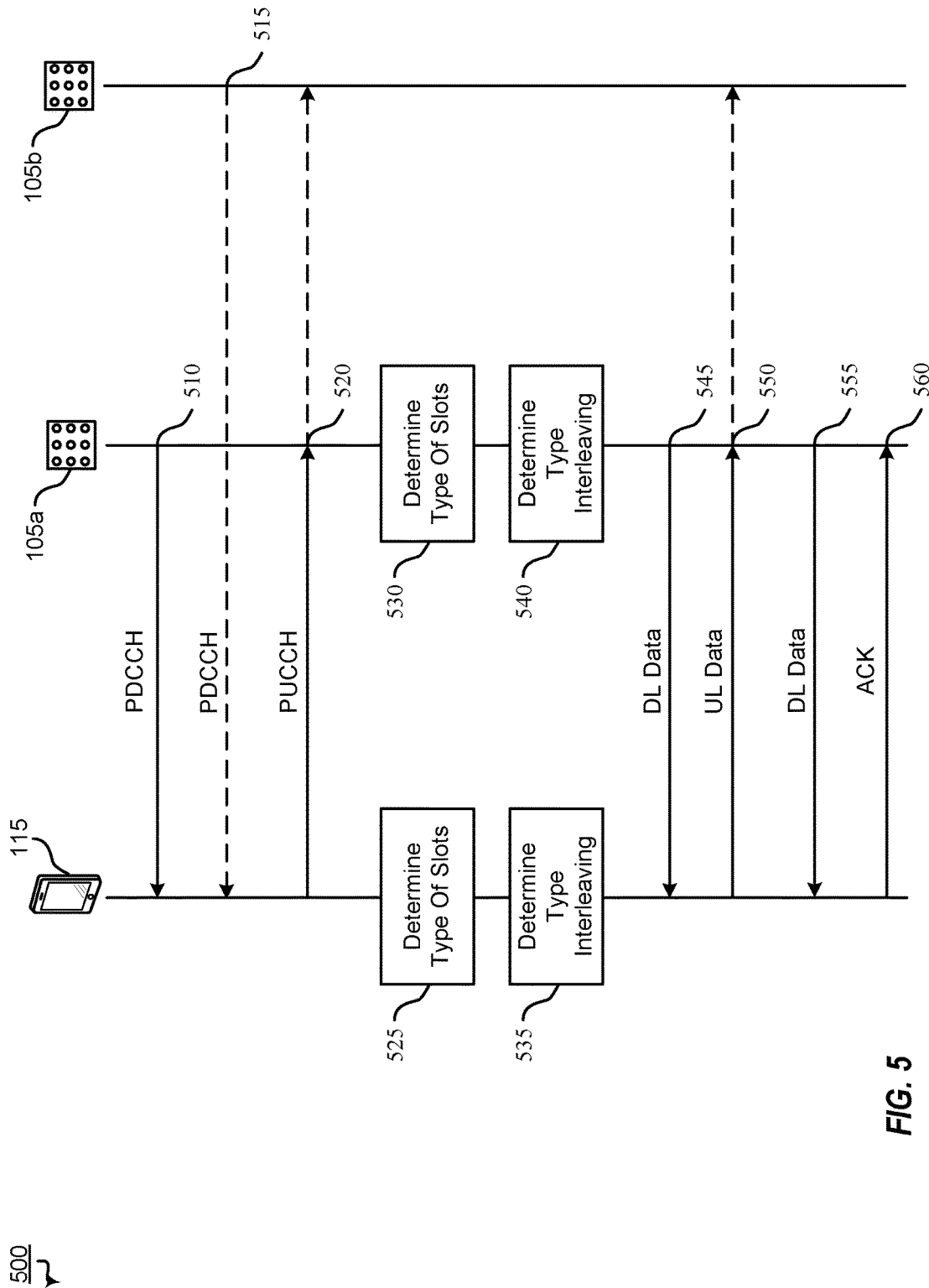
FIG. 5 is a diagram of an example of a ladder diagram of symbol level interleaving operations according to some embodiments of the present disclosure.
Figure 6:
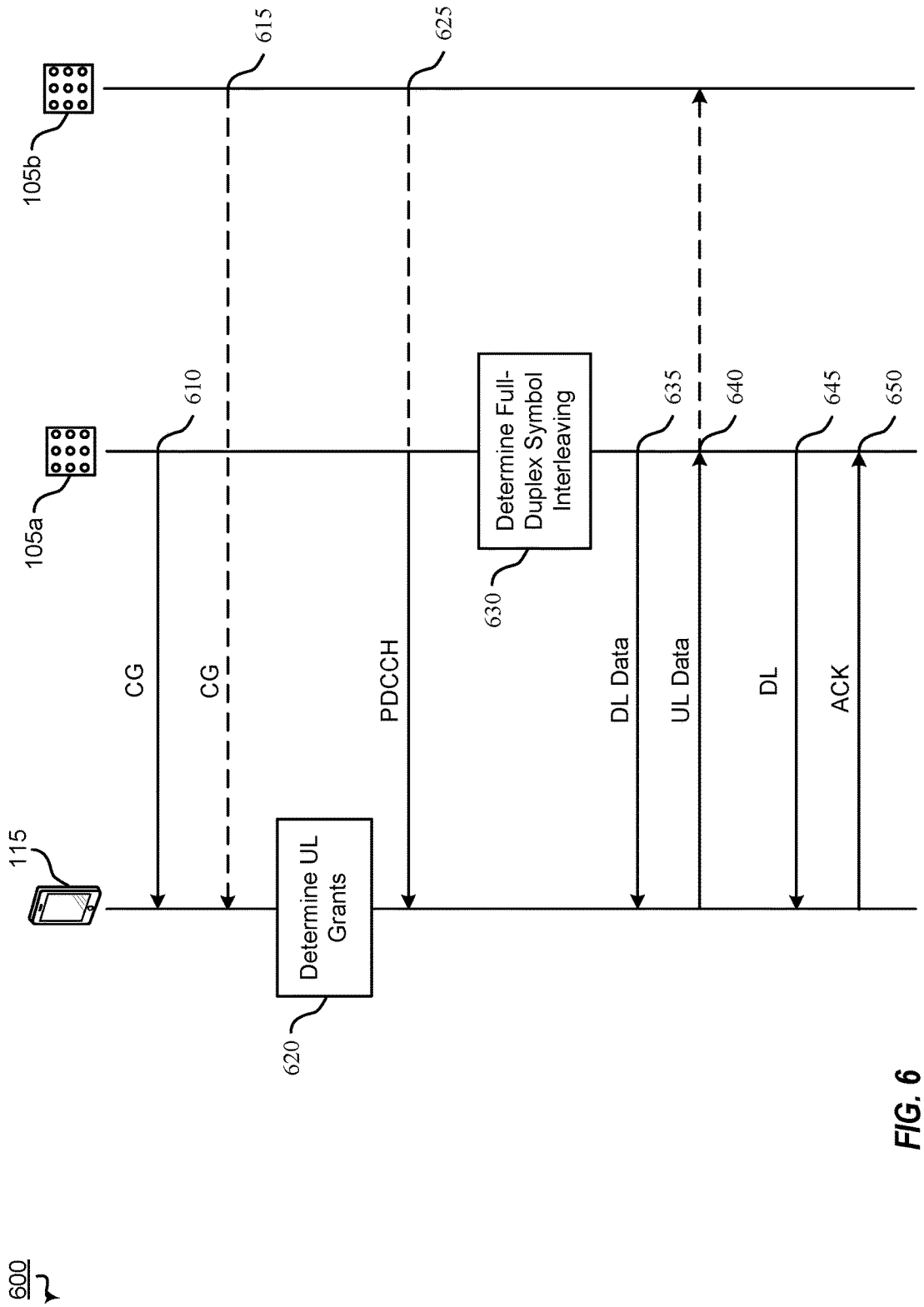
FIG. 6 is a diagram of another example of a ladder diagram of U symbol level interleaving operations according to some embodiments of the present disclosure.

FIGS. 5 and 6 illustrate example ladder diagrams for symbol level interleaving operations. Referring to FIG. 5, FIG. 5 is a ladder diagram of an example of symbol level interleaving. Said another way, the interleaving mode or scheme can be modified based on the type of symbol (e.g., full- or half-duplex) of a slot and vary from symbol to symbol.

At 510, a first TRP 105a generates and transmits a first PDCCH transmission. For example, the first TRP 105a sends a PDCCH transmission scheduling a slot. The PDCCH may schedule a portion or all of a frequency of a slot.

At 515, a second TRP 105b, optionally, generates and transmits a second PDCCH transmission. For example, the second TRP 105b sends a second PDCCH transmission scheduling a portion of the slot. The second PDCCH may schedule a second portion the slot.

At 520, a UE 115, optionally generates and transmits a PUCCH transmission. For example, the UE 115 sends a PUCCH transmission scheduling a portion of the slot to the first TRP, the second TRP, or both. The PUCCH may schedule an portion uplink portion of the slot and/or acknowledge receipt of the PDCCH(s).

At 525, the UE 115 determines symbol type for symbols of the slot based on the PDCCH transmission or transmissions. For example, the UE 115 determines half-duplex and full-duplex symbols of the slot based on scheduling indicated by the PDCCH, and optionally other scheduling transmissions and/or uplink data to send, such as the PUCCH.

Similarly, the network, such as one or more network entities thereof, may also determine symbol type. For example, at 530, the first TRP 105a determines symbol type based on the PDCCH transmission or transmissions. For example, the first TRP 105a determines half-duplex and full-duplex symbols of the slot based on scheduling indicated by the PDCCH, and optionally other scheduling transmissions sent or received.

At 535, the UE 115 determines a type of symbol interleaving based on the symbol types. For example, the UE 115 may determine to use one or more type of symbol interleaving based on the symbol types To illustrate, the UE 115 may determine to use one interleaving scheme (e.g., a full-duplex interleaving scheme) for full-duplex symbols and another interleaving scheme (e.g., a half-duplex interleaving scheme) for half-duplex symbols. As another illustration, the UE 115 may select one full-duplex interleaving scheme from a set of full-duplex interleaving schemes for full-duplex symbols and another interleaving scheme from a set of half-duplex interleaving schemes for half-duplex symbols. For examples of interleaving see FIGS. 9A-9E.

Similarly, the network, such as one or more network entities thereof, may also determine symbol type. For example, at 540, the first TRP 105a determines a type of symbol interleaving based on the symbol types, similar to the UE 115.

At 545, the first TRP 105a generates and transmits downlink data during a portion of the slot. For example, the first TRP 105a transmits a first symbol using a first interleaving scheme. To illustrate, the first TRP 105a transmits a first symbol using a full-duplex scheme.

At 550, the UE 115 generates and transmits uplink data during the portion of the slot. For example, the UE 115 transmits a first symbol using the first interleaving scheme and simultaneously with the first TRP 105a. To illustrate, the first TRP 105a transmits a first symbol using the full-duplex scheme.

Although the downlink transmissions of 545 and 550 are illustrated on separate lines/timing, such transmissions may be at least partially concurrent, such as simultaneous transmissions.

At 555, the first TRP 105a generates and transmits second downlink data during a second portion of the slot. For example, the first TRP 105a transmits a second symbol using a second interleaving scheme. To illustrate, the first TRP 105a transmits a second symbol using a half-duplex scheme.

The UE 115 may not transmit uplink data (e.g., a second symbol) during this second portion of the slot. For example, the UE 115 may not have been scheduled to transmit or may have no data to send.

At 560, the UE 115 generates and transmits an acknowledgment responsive to the downlink data.

Thus, in the example in FIG. 5, the UE and network entities employ multiple interleaving modes for a particular slot and employ symbol level interleaving. That is, the UE and network can modify interleaving schemes at the symbol level.

Referring to FIG. 6, FIG. 6 is a ladder diagram of an example of symbol level interleaving for semi-static configuration. Said another way, the symbol level interleaving can be adapted for use with configured grants and SPS and/or when a device may not be sure of the symbol type.

At 610, a first TRP 105a generates and transmits a first configured grant (CG) transmission. For example, the first TRP 105a sends a first CG transmission scheduling multiple first uplink grants for the UE 115. To illustrate, the first TRP 105a sends CG transmission scheduling multiple uplink grants for the UE 115 and the first TRP 105a, a second TRP 105b, or both.

At 615, the second TRP 105b, optionally, generates and transmits a second configured grant (CG) transmission. For example, the second TRP 105b sends a second CG transmission scheduling multiple second uplink grants for the UE 115. To illustrate, the second TRP 105b sends CG transmission scheduling multiple uplink grants for the UE 115 and the second TRP 105b.

At 620, the UE 115 determines the multiple uplink grants based on the CG transmission(s). For example, the UE 115 determines a timing of multiple potential uplink slots for the UE 115 to use if the UE 115 has data to send.

At 625, the first TRP 105a, the second TRP 105b, or both, generate and transmit a PDCCH transmission, as described with reference to FIGS. 4 and 5. For example, the first TRP 105a sends a PDCCH transmission scheduling a downlink portion of a slot.

At 630, the first TRP 105a, the second TRP 105b, or both, determine to use a particular type of interleaving. For example, the first TRP 105a determines or assumes to use full-duplex symbol interleaving based on the CG and PDCCH transmissions. To illustrate, as the UE 115 is allotted uplink bandwidth by the CG transmission(s) and the UE 115 may not signal whether the UE 115 is using such uplink bandwidth, the network is unaware of whether such bandwidth is being used and thus, the a symbol type. As the network is unaware or not actually able to determine/predict a symbol type, the network may default/revert to a particular type of interleaving, such as full-duplex interleaving.

At 635, the first TRP 105a generates and transmits downlink data during a portion of the slot. For example, the first TRP 105a transmits a first symbol using the determined interleaving scheme. To illustrate, the first TRP 105a transmits a first symbol using the full-duplex scheme.

At 640, the UE 115 generates and transmits uplink data during the portion of the slot. For example, the UE 115 transmits a first symbol using the first interleaving scheme and simultaneously with the first TRP 105a. To illustrate, the first TRP 105a transmits a first symbol using the full-duplex scheme. Although not illustrated in FIG. 6, the UE 115 may similarly assume full-duplex like the network or may determine to use full-duplex as described in FIG. 5 because the UE 115 actually knows that it will or will not be sending data.

Although the downlink transmissions of 635 and 640 are illustrated on separate lines/timing, such transmissions may be at least partially concurrent, such as simultaneous transmissions.

At 645, the first TRP 105a generates and transmits second downlink data during a second portion of the slot. For example, the first TRP 105a transmits a second symbol using the determined interleaving scheme. To illustrate, the first TRP 105a transmits a second symbol using the full-duplex scheme. The UE 115 may not transmit uplink data (e.g., a second symbol) during this second portion of the slot. For example, the UE 115 may not have been scheduled to transmit or may have no data to send.

At 650, the UE 115 generates and transmits an acknowledgment responsive to the downlink data.

Thus, in the example in FIG. 6, the UE and network entities employ a particular interleaving mode for a slot when symbol type cannot be ascertained. Particular devices may be set to operate in one type of interleaving mode depending on hardware capabilities or may switch between the interleaving modes of FIGS. 4, 5, and/or 6 based on one or more conditions or inputs.

Additionally, or alternatively, one or more operations of FIGS. 4, 5, and/or 6 may be added, removed, substituted in other implementations. For example, the configured grants transmissions, of FIG. 6 may be used in place of or in addition to the PDCCH transmissions of FIG. 5. As another example, SPS transmissions may be used in place of the configured grants transmissions, of FIG. 6.

Figure 7:
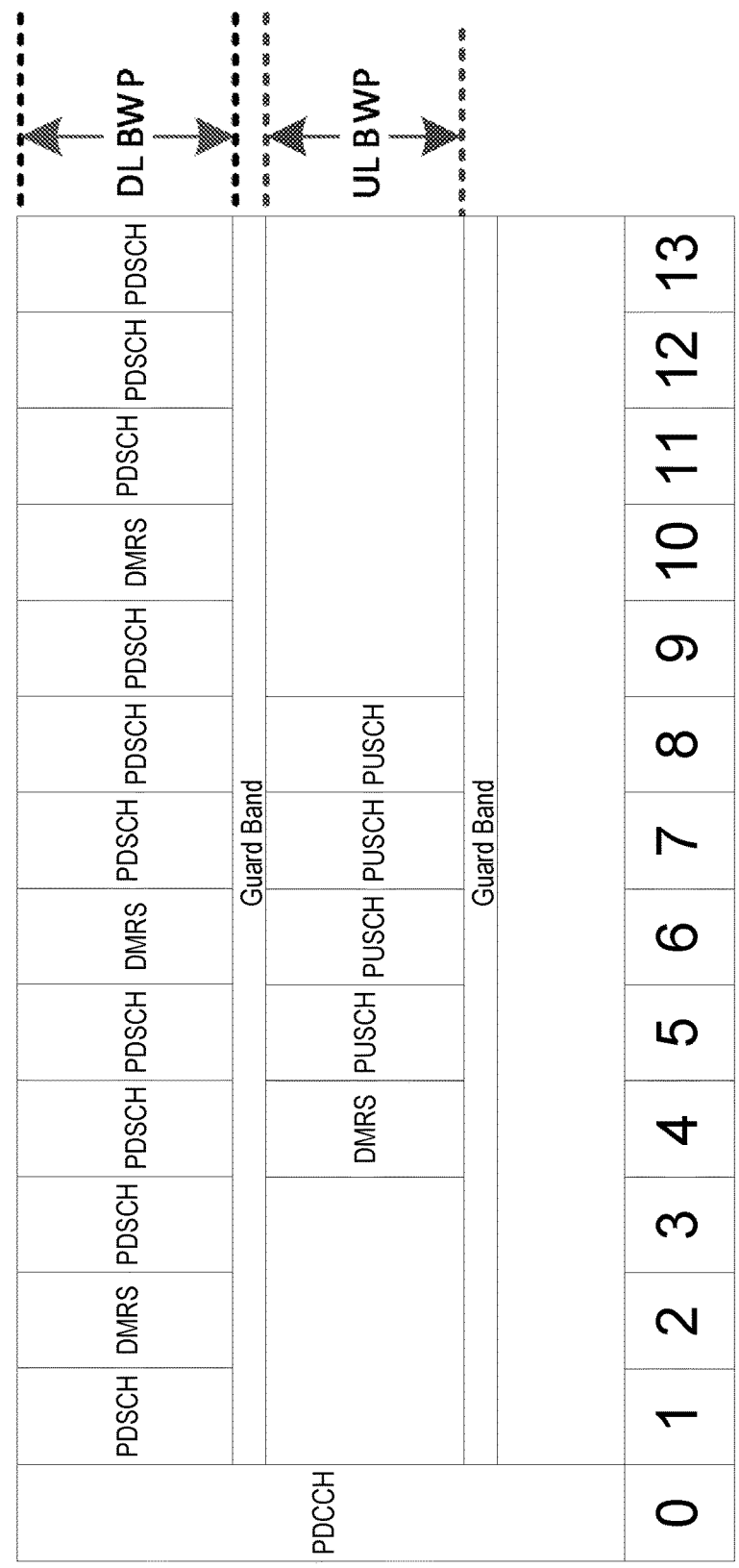
FIG. 7 is a timing diagram illustrating full-duplex and half-duplex symbols of a slot.

FIG. 7 is a timing diagram illustrating full-duplex and half-duplex symbols of a slot. In FIG. 7, a slot including 14 sub-slots, refereed to a symbols, is illustrated. The horizontal axis represents time and the vertical axis represents frequency for operations between a UE and a base station.

During a first symbol (symbol 0), the UE receives a PDCCH from the base station using a majority of the frequency. During a second symbol (symbol 1) through a fourteenth symbol (symbol 13), the UE receives a downlink transmission (e.g., DMRS or PDSCH) from the base station using a portion of the frequency, such as a downlink BWP portion. During a fifth symbol (symbol 4) through a ninth symbol (symbol 8), the UE transmits an downlink transmission (e.g., DMRS or PUSCH) to the base station using another portion of the frequency, such as an uplink BWP portion.

During full-duplex operations, a slot configuration as shown in FIG. 7, may be set or signaled. Although the devices may be operating in full-duplex modes and the slot may be indicated as a full-duplex slot, during the slot the devices will be operating in half-duplex modes periodically. For example, the devices (e.g., the UE) will be operating in half-duplex modes during symbols 1-3, and 9-13 (i.e., the time corresponding to such symbols). Symbols experiencing full-duplex operation may suffer from self-interference, while the other symbols experiencing half-duplex operation may not suffer from self-interference. Additionally, or alternatively, using the same interleaving scheme over the entire slot might not capture the benefit of interleaving (e.g., the full interleaving gain).

In addition, even if slots are configured or scheduled for full-duplex operation for each symbol, the symbols may only experience a half-duplex operation in some circumstances. For example, when using configured grants (CGs) or semi-persistent scheduling (SPS) uplink and/or downlink grants may be configured in advanced and not dynamically or on demand. Thus, a UE or base station may not have data to transmit in each symbol and a symbol that was scheduled for full-duplex may only operate as half-duplex.

FIG. 8A is a diagram of an example antenna layout, and FIG. 8B is a diagram of an example timing diagram. FIG. 8C is a diagram illustrating antenna operations for the antenna layout of FIG. 8A during the timing diagram of FIG. 8B. FIG. 8D is a diagram illustrating antenna leakage for the antenna layout of FIG. 8A during the timing diagram of FIG. 8B.

Referring to FIG. 8A, an antenna architecture is illustrated with two separate panels for simultaneous Tx and Rx operations. In some implementations, panel #1 is for DL transmission at both edges of a band, and panel #2 is for UL reception at middle of the band. Such an architecture may improve isolation, such as by greater than 50 dB.

When operating in sub-band full duplex, the isolation may be improved by greater than 40 dB by having downlink and uplink in a different portion of the band and a guard band between the uplink and downlink portions and by utilizing one or more other improvements. The improvements may include using receive Weighted OverLap and Add (WOLA) to reduce Adjacent Channel Leakage Ration (ACLR) leakage to uplink signals, include an analog low pass filter (LPF) to improve the dynamic range of an analog-to-digital converter (ADC), and/or include an improvement in receive Automatic Gain Control (AGC) states to improve the noise figure (NF).

In addition to or in the alternative of such improvements, a digital integrated circuit of the ACLR may lead to a 20 dB or greater improvement by using a non-linear model for each transmit and receive pair.

Referring to FIG. 8B, an example timing diagram for FDD is illustrated where both panels operate, i.e., operate in full-duplex. FIG. 8C illustrates how the panels of FIG. 8A operate during the timing diagram of FIG. 8B. FIG. 8D illustrates antenna performance of FIG. 8A during the timing diagram of FIG. 8B.

Figure 9A:
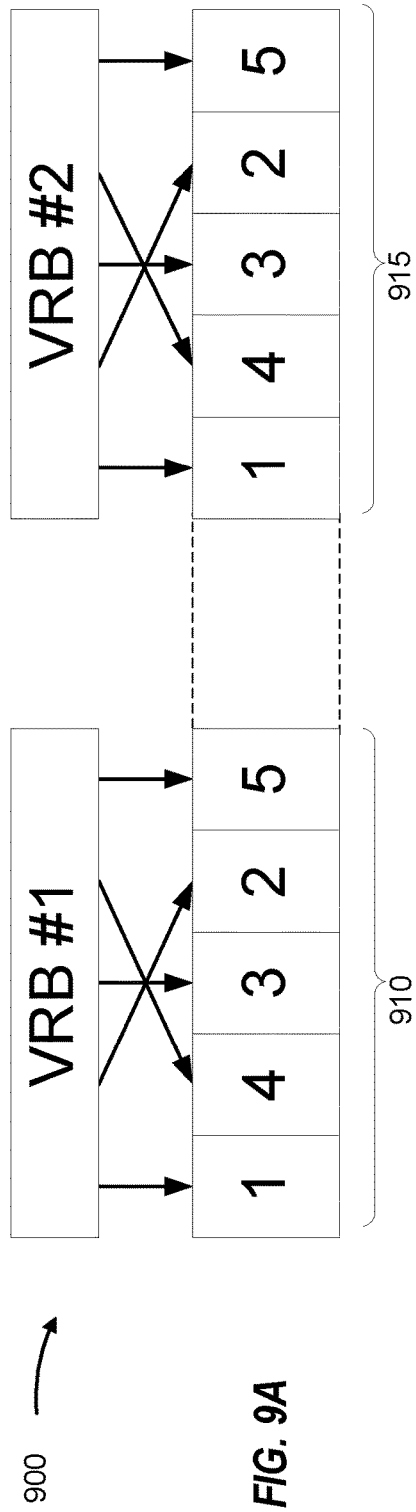
Figure 9B:
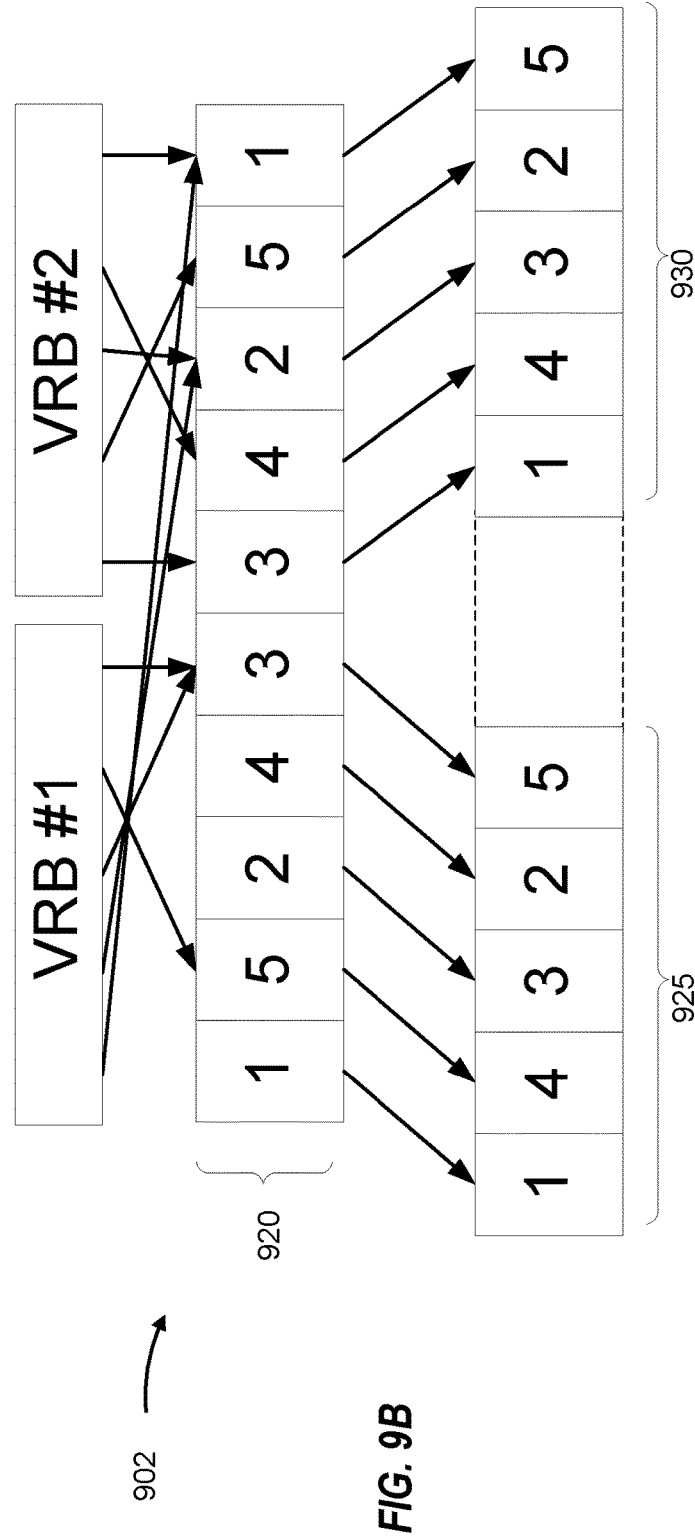
Figure 9E:
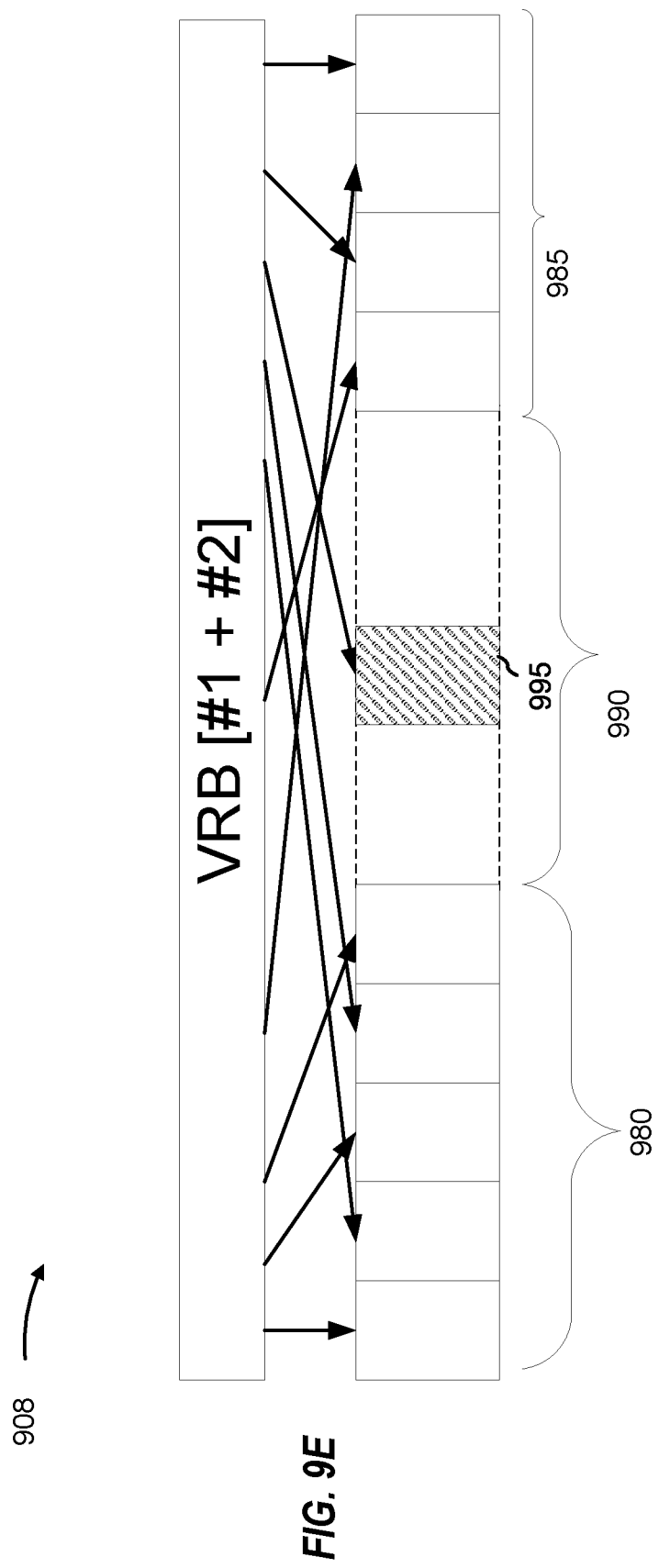

FIGS. 9A-9E illustrate examples of symbol level interleaving schemes. Symbol level interleaving may include or correspond to virtual resource block (VRB) to physical resource block (PRB) mapping. FIG. 9A is an example of legacy interleaving for multiple VRB segments, FIG. 9B is an example of a new type of interleaving for multiple VRB segments, FIGS. 9C and 9D illustrate segment wide joint interleaving, and FIG. 9E illustrates interleaving for one Resource Indicator Value (RIV). A RIV is a set of consecutive RBs within a BWP.

Referring to FIG. 9A, an example of legacy interleaving for two VRB segments is shown. In FIG. 9A, interleaving is applied to each VRB set separately when converting/mapping from the virtual domain to the physical domain.

FIG. 9A illustrates a VRB-to-PRB mapping scheme 900 in accordance with this approach, whereby a first VRB group (i.e., VRB #1) and a second VRB group (i.e., VRB #2) map directly to PRBs in a first disjoint BWP segment 910 and a second disjoint BWP segment 915, respectively, with independent interleaving. In other words, the individual RBs of VRB #1 are interleaved with respect to each other, but not with respect to the individual RBs of VRB #2.

To illustrate, a first VRB of the first VRB segment is mapped to a first physical resource block, a second VRB of the first VRB segment is mapped to a fourth physical resource block, a third VRB of the first VRB segment is mapped to a third physical resource block, a fourth VRB of the first VRB segment is mapped to a second physical resource block, and a fifth VRB of the first VRB segment is mapped to a fifth physical resource block. In the example of FIG. 9A, the second VRB segment has the same interleaving/mapping as the first VRB segment and the physical resource segments may be separated from one another.

Referring to FIG. 9B, an example of a new type interleaving for two VRB segments is shown. In FIG. 9B, interleaving is applied to an appended or concatenated VRB segment that includes the two VRB segments when converting/mapping from the virtual domain to the physical domain. For example, the first and second VRB segments are joined together and then a different type of interleaving is applied from the legacy interleaving of FIG. 9.

FIG. 9B illustrates a VRB-to-PRB mapping scheme 902 in accordance with this approach, whereby a first VRB group (i.e., VRB #1) and a second VRB group (i.e., VRB #2) are merged into a combined VRB 920 while being interleaved together, after which the combined and interleaved VRB 920 is mapped to a first disjoint BWP segment 925 and a second disjoint BWP segment 930, respectively.

To illustrate, a first VRB of the first VRB segment is mapped to a first physical resource block, a second VRB of the first VRB segment is mapped to a third physical resource block, a third VRB of the first VRB segment is mapped to a fifth physical resource block, a fourth VRB of the first VRB segment is mapped to a seventh physical resource block, and a fifth VRB of the first VRB segment is mapped to a ninth physical resource block. Conversely, a first VRB of the second VRB segment is mapped to a tenth physical resource block, a second VRB of the second VRB segment is mapped to an eighth third physical resource block, a third VRB of the second VRB segment is mapped to a sixth physical resource block, a fourth VRB of the second VRB segment is mapped to a fourth physical resource block, and a fifth VRB of the second VRB segment is mapped to a second physical resource block. After this joint mapping, the physical resources may be split apart. To illustrate, the first though fifth physical resources are separated from the sixth through tenth physical resources.

Referring to FIG. 9C, an example of joint interleaving across a BWP is shown. In FIG. 9C, interleaving is applied to the entire BWP including unused VRBs. Such an interleaving may lead to a contiguous allocation or a non-contiguous allocation, as illustrated in FIG. 9C. Additionally, or alternatively, such a mapping may cause the DL PRs to overlap with the UL band or the guard band. Such potential complications can be addressed as shown and described in FIGS. 9C and 9D. Additionally, if an overlap occurs the device may just assume an error and use an alternative interleaving scheme or no interleaving.

FIG. 9C illustrates rate matching of overlapped resources. For example, if a downlink PR overlaps a uplink PR or guard band the device (e.g., UE) assumes to rate match the two overlapping resources. Such overlapping resources may not be available for PDSCH transmission. For example, a lower priority overlapping resource may be omitted. To illustrate, if a UE has VRBs of 1 to N and VRB 1 overlaps with VRB 2, the UE may send VRB 1 and assume VRB 2 is not currently available for PDSCH transmission.

FIG. 9C illustrates a VRB-to-PRB mapping scheme 904 in accordance with this approach, whereby a first VRB group (i.e., VRB #1) and a second VRB group (i.e., VRB #2) are jointly interleaved across a first disjoint BWP segment 935 and a second disjoint BWP segment 940, respectively. In the embodiment of FIG. 9C, the allocation of the first and second VRBs is across PRBs that overlap with an intervening BWP segment 945 between the first and second disjoint BWP segments. In particular, one particular PRB 950 to which VRB #2 is mapped overlaps with the intervening BWP segment 945. In an example, the first and second disjoint BWP segments comprise DL data, and the intervening BWP segment comprises a GB, UL data, or a combination thereof. So, VRB #2's allocation of PRB 1220 may overlap with the GB and/or with one or UL data transmission. In other designs (e.g., where Type 0 or bitmap-based VRB-to-PRB mapping rule is used), the overlap can be avoided.

Referring to FIG. 9D, another example of joint interleaving across a BWP is shown. In FIG. 9D, the interleaving across the BWP includes cyclic repetition of an overlapping resource. For example, if the corresponding PRB of an allocation overlaps with the UL BWP, the UE assumes cyclic repetition of the overlapped resources. As compared to FIG. 9E, instead of rate matching the overlapped resource and possibly not transmitting a lower priority resource, the UE may move the overlapped resource or resources by cyclic repetition. As illustrated in FIG. 9D, the rate matched overlapped resource of FIG. 9C is moved downwards in FIG. 9D as indicated by the arrow.

FIG. 9D illustrates a VRB-to-PRB mapping scheme 906 in accordance with an approach whereby the UE interprets an overlap as a cycling repetition at the UE. In FIG. 9D, a first VRB group (i.e., VRB #1) and a second VRB group (i.e., VRB #2) are jointly interleaved across a first disjoint BWP segment 955 and a second disjoint BWP segment 960, respectively. In the embodiment of FIG. 9D, the allocation of the first and second VRBs is across PRBs that overlap with an intervening BWP segment 965 between the first and second disjoint BWP segments. In particular, one particular PRB 970 to which VRB #2 is mapped overlaps with the intervening BWP segment 965. In this case, the UE interprets PRB 870 as a cycling repetition of another PRB that is not inside of the intervening BWP segment 965, in this case, PRB 975 which is part of the first disjoint BWP segment 955.

Referring to FIG. 9E, an example of legacy interleaving for one RIV is shown. In FIG. 9E, interleaving follows the legacy VRB-to-PRB allocation and may include overlap correction. For example, if a PRB(s) overlap with the UL BWP, the resources may be rate matched (e.g., the UL BWP is in the PDSCH resources and the UL data is not allowed for PDSCH transmission) or moved, such as by cyclic repetition similar to FIG. 9D.

FIG. 9E illustrates a VRB-to-PRB mapping scheme 908 in accordance with this approach, whereby a consolidated VRB associated with a single RIV is interleaved across a first disjoint BWP segment 980 and a second disjoint BWP segment 985, respectively. In the embodiment of FIG. 9E, the allocation of the VRB is across PRBs that overlap with an intervening BWP segment 990 between the first and second disjoint BWP segments. In particular, one particular PRB 995 to which VRB #2 is mapped overlaps with the intervening BWP segment 990. In an example, the first and second disjoint BWP segments comprise DL data, and the intervening BWP segment comprises a GB, UL data, or a combination thereof. So, VRB #2's allocation of PRB 995 may overlap with the GB and/or with one or UL data transmission. In a further example, the overlap reflected in FIG. 9E with respect to PRB 995 may be handled via any of the mechanisms described above with respect to the overlap of PRB 950 in FIG. 9C (e.g., UE performing rate-matching only whereby PDSCH PRBs in the overlapping part are unavailable for PDSCH transmission, DL data omitted from this PRB, interpreted as error condition or cycling repetition, etc.). In other designs (e.g., where Type 0 or bitmap-based VRB-to-PRB mapping rule is used), the overlap can be avoided. In addition to, or in the alternative of one or more of the interleaving schemes of FIGS. 9A-9E, a device may be configured to use no interleaving.

Figures 10, 11:
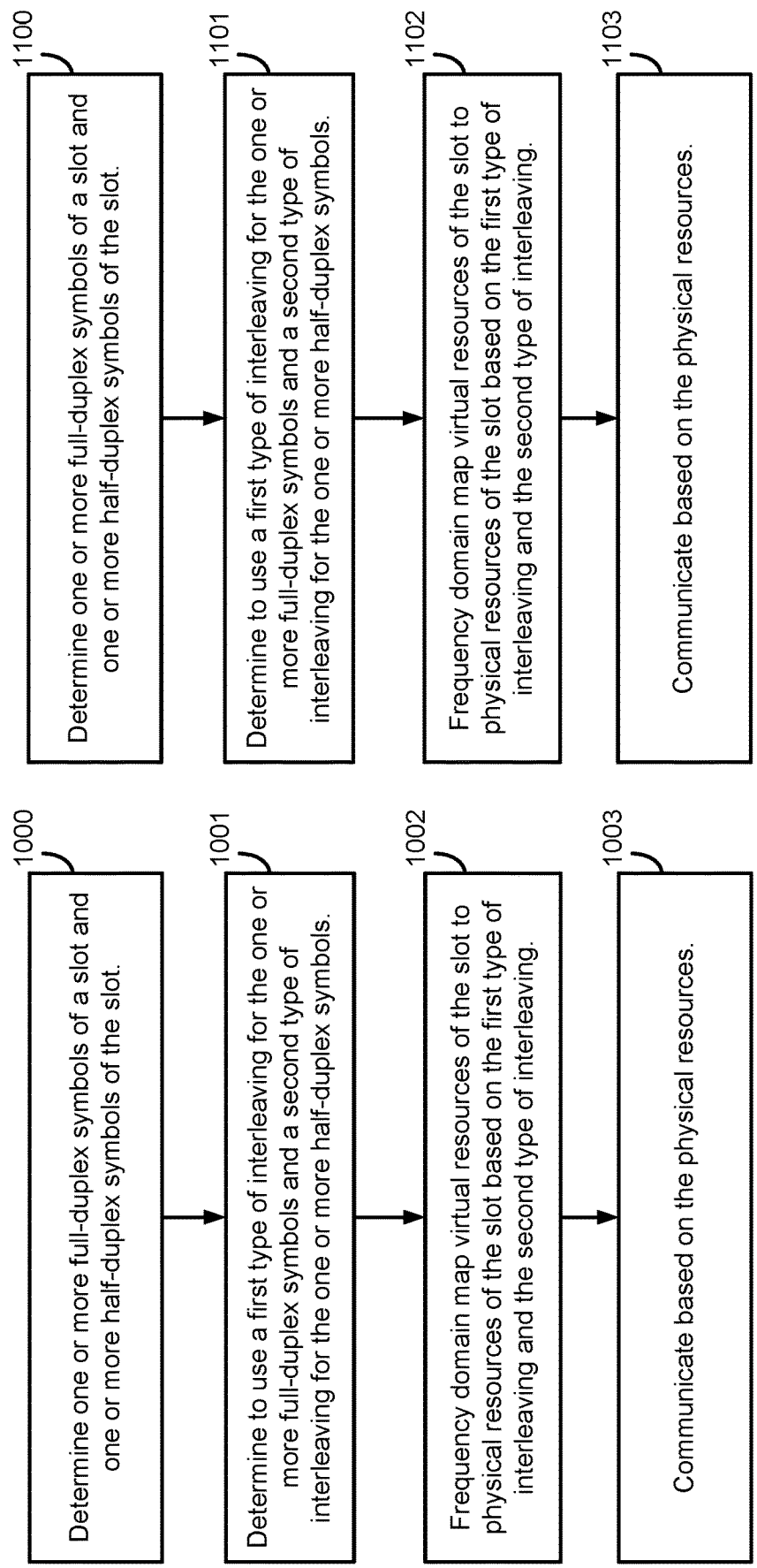
FIG. 10 is a flow diagram illustrating example blocks executed by a UE configured according to an aspect of the present disclosure.
FIG. 11 is a flow diagram illustrating example blocks executed by a base station configured according to an aspect of the present disclosure.
Figure 14:
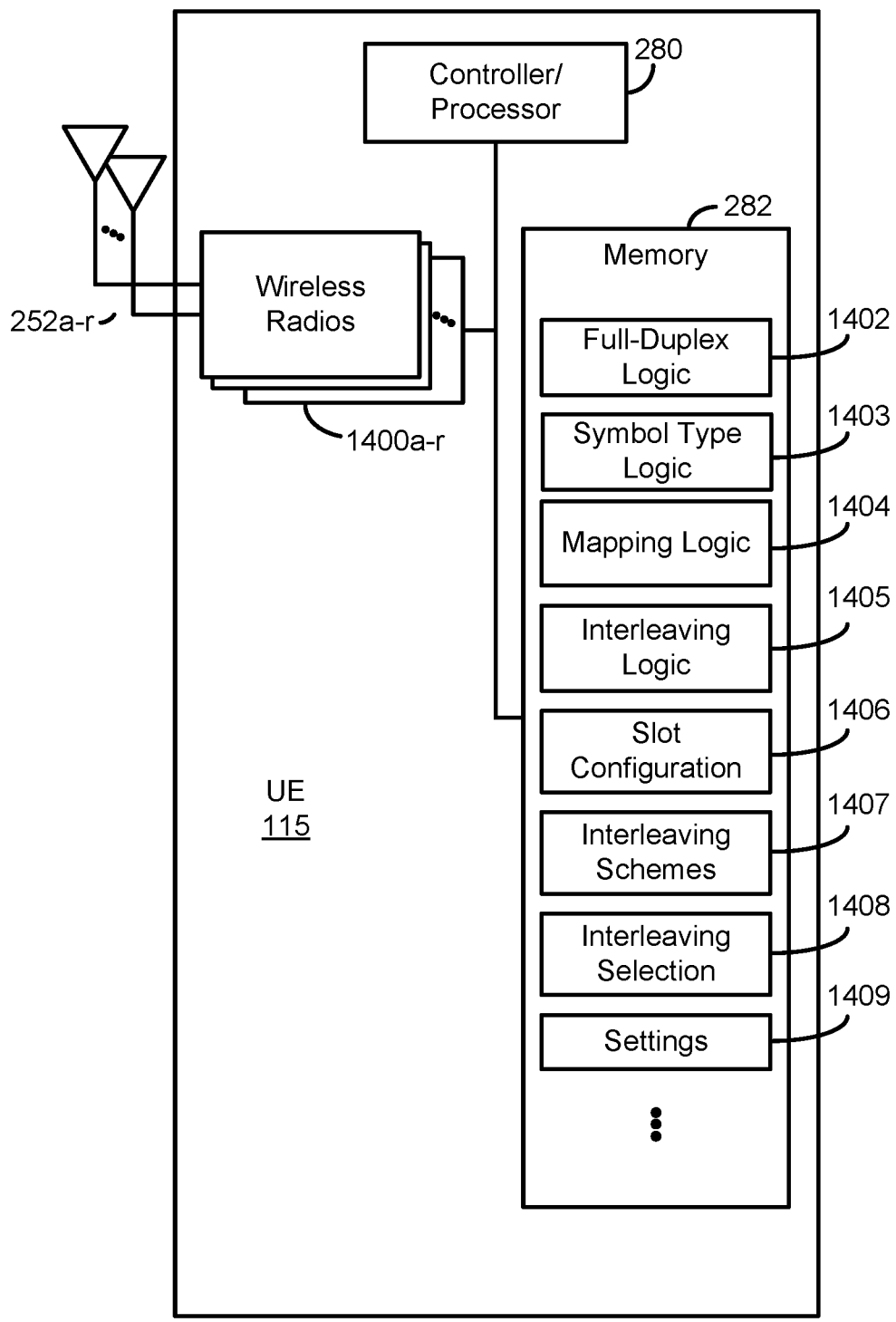
FIG. 14 is a block diagram conceptually illustrating a design of a UE configured to perform precoding information update operations according to some embodiments of the present disclosure.

FIG. 10 is a flow diagram illustrating example blocks executed by a UE configured according to an aspect of the present disclosure. The example blocks will also be described with respect to UE 115 as illustrated in FIG. 14. FIG. 14 is a block diagram illustrating UE 115 configured according to one aspect of the present disclosure. UE 115 includes the structure, hardware, and components as illustrated for UE 115 of FIG. 2. For example, UE 115 includes controller/processor 280, which operates to execute logic or computer instructions stored in memory 282, as well as controlling the components of UE 115 that provide the features and functionality of UE 115. UE 115, under control of controller/processor 280, transmits and receives signals via wireless radios 1400a-r and antennas 252a-r. Wireless radios 1400a-r includes various components and hardware, as illustrated in FIG. 2 for UE 115, including modulator/demodulators 254a-r, MIMO detector 256, receive processor 258, transmit processor 264, and TX MIMO processor 266. As illustrated in the example of FIG. 14, memory 282 stores full-duplex logic 1402, symbol type logic 1403, mapping logic 1404, interleaving logic 1405, slot configuration data 1406, interleaving schemes data 1407, interleaving selection data, 1408, and settings data 1409.

At block 1000, a wireless communication device, such as a UE, determines one or more full-duplex symbols of a slot and one or more half-duplex symbols of the slot. For example, the UE 115 determines a slot configuration and symbol types thereof, as described with reference to FIGS. 4-6.

At block 1001, the UE 115 determines to use a first type of interleaving for the one or more full-duplex symbols and a second type of interleaving for the one or more half-duplex symbols. For example, the UE 115 determines a particular type of interleaving for each symbol type based on the slot configuration and/or symbol types thereof, as described with reference to FIGS. 4-6.

At block 1002, the UE 115 frequency domain maps virtual resources of the slot to physical resources of the slot based on the first type of interleaving and the second type of interleaving. For example, the UE 115 allocates physical resources for the virtual resources of the slot based on the first and second types of interleaving, as described with reference to FIGS. 4-6 and 9A-9E.

At block 1003, the UE 115 communicates based on the physical resources. For example, the UE 115 transmits and receives data based on the first and second types of interleaving, as described with reference to FIGS. 4-6.

The UE 115 may execute additional blocks (or the UE 115 may be configured further perform additional operations) in other implementations. For example, the UE 115 may perform one or more operations described above. As another example, the UE 115 may perform one or more aspects as described below.

In a first aspect, the apparatus is further configured to receive a physical downlink control channel (PDCCH) scheduling the slot; and to determine a configuration of the slot based on the PDCCH, wherein determining the one or more full-duplex symbols and the one or more half-duplex symbols is based on the configuration.

In a second aspect, alone or in combination with the first aspect, the apparatus is further configured to transmit a physical uplink control channel (PUCCH) scheduling uplink data for the slot; and to determine a configuration of the slot based on the PUCCH, wherein determining the one or more full-duplex symbols and the one or more half-duplex symbols is based on the configuration.

In a third aspect, alone or in combination with one or more of the first aspect through the second aspect, communicating based on the physical resources includes: transmitting uplink data based on the first type of interleaving for the one or more full-duplex symbols; and receiving downlink data based on the first type of interleaving for the one or more full-duplex symbols.

In a fourth aspect, alone or in combination with the third aspect, communicating based on the physical resources further includes: transmitting uplink data based on the second type of interleaving for the one or more half-duplex symbols; and receiving downlink data based on the second type of interleaving for the one or more half-duplex symbols.

In a fifth aspect, alone or in combination with the fourth aspect, the uplink data is transmitted to a first transmission reception point (TRP) and the downlink data is received from a second TRP.

In a sixth aspect, alone or in combination with the fifth aspect, the first TRP and the second TRP correspond to a single base station.

In a seventh aspect, alone or in combination with the sixth aspect, the first TRP and the second TRP correspond to multiple base stations.

In an eighth aspect, alone or in combination with the seventh aspect, the uplink data is transmitted to a particular TRP and the downlink data is received from the particular TRP.

In a ninth aspect, alone or in combination with one or more of the first aspect through the eighth aspect, the first type of interleaving and the second type of interleaving are the same.

In a tenth aspect, alone or in combination with one or more of the first aspect through the ninth aspect, the first type of interleaving and the second type of interleaving are different.

In an eleventh aspect, alone or in combination with one or more of the first aspect through the tenth aspect, the interleaving types include no interleaving, legacy interleaving on each virtual resource block (VRB) segment, new interleaving on each VRB segment, joint interleaving over a bandwidth part (BWP), or legacy allocation for a resource indicator value (RIV).

In a twelfth aspect, alone or in combination with one or more of the first aspect through the eleventh aspect, the frequency domain mapping includes: interleaving a first virtual resource block (VRB) segment to generate a first interleaved physical resource block (PRB) segment; interleaving a second VRB segment to generate a second interleaved PRB segment; and assigning the first interleaved PRB segment and the second interleaved PRB segment physical resources.

In a thirteenth aspect, alone or in combination with one or more of the first aspect through the twelfth aspect, frequency domain mapping includes: joining a first virtual resource block (VRB) segment and a second a first VRB segment to generate a joined VRB segment; interleaving the joined VRB segment to generate an interleaved joined physical resource block (PRB) segment; splitting the interleaved joined PRB segment into a first PRB segment and second PRB segment; and assigning the first PRB segment and the second PRB segment physical resources.

In a fourteenth aspect, alone or in combination with one or more of the first aspect through the thirteenth aspect, frequency domain mapping includes: interleaving a bandwidth part (BWP) to generate an interleaved BWP; and assigning the interleaved BWP physical resources.

In a fifteenth aspect, alone or in combination with the fourteenth aspect, the assigned physical resources are contiguous or non-contiguous.

In a sixteenth aspect, alone or in combination with the fifteenth aspect, resources of the BWP each have a priority, and wherein at least two resources of the BWP overlap each other and are overlapping resources, and wherein a lower priority resource of the overlapping resources is rate matched.

In a seventeenth aspect, alone or in combination with the sixteenth aspect, resources of the BWP each have a priority, and wherein at least two resources of the BWP overlap each other and are overlapping resources, and wherein a lower priority resource of the overlapping resources is moved by cyclic repetition.

In an eighteenth aspect, alone or in combination with one or more of the first aspect through the seventeenth aspect, the UE is configured to perform a particular type of full-duplex interleaving from a set of types of full-duplex interleaving.

In a nineteenth aspect, alone or in combination with one or more of the first aspect through the eighteenth aspect, the apparatus is further configured to select a particular type of full-duplex interleaving from a set of types of full-duplex interleaving; and select a particular type of half-duplex interleaving from a set of types of half-duplex interleaving.

In a twentieth aspect, alone or in combination with the nineteenth aspect, the set of types of full-duplex interleaving includes no interleaving, legacy interleaving on each virtual resource block (VRB) segment, new interleaving on each VRB segment, joint interleaving over a bandwidth part (BWP), or legacy allocation for a resource indicator value (RIV).

In a twenty-first aspect, alone or in combination with one or more of the first aspect through the twentieth aspect, the apparatus is further configured to receive a radio resource control (RRC) message indicating one or more interleaving configurations.

In a twenty-second aspect, alone or in combination with one or more of the first aspect through the twenty-first aspect, the apparatus is further configured to determine if the full-duplex symbol is downlink/downlink (DL/DL) or downlink/uplink (DL/UL); and based on the determining, select a particular type of full-duplex interleaving from a set of types of full-duplex interleaving.

In a twenty-third aspect, alone or in combination with one or more of the first aspect through the twenty-second aspect, a particular interleaving configuration within a set of interleaving configurations can be dynamically indicated via a scheduling downlink control information (DCI) or a via a control message, wherein the control message is a medium access control control element (MAC-CE) or a radio resource control (RRC) configuration message.

In a twenty-fourth aspect, alone or in combination with one or more of the first aspect through the twenty-third aspect, the apparatus, prior to determining the one or more full-duplex symbols of the slot, is further configured to transmit a capabilities message indicating that the UE is configured for symbol level interleaving.

In a twenty-fifth aspect, alone or in combination with one or more of the first aspect through the twenty-fourth aspect, the apparatus, prior to determining the one or more full-duplex symbols of the slot, is further configured to transmit a capabilities message indicating that the UE is a symbol level interleaving capable UE.

In a twenty-sixth aspect, alone or in combination with one or more of the first aspect through the twenty-fifth aspect, the apparatus, prior to determining the one or more full-duplex symbols of the slot, is further configured to receive a configuration message from a networking entity indicating a symbol level interleaving mode.

Accordingly, a UE and a base station may perform symbol level interleaving operations. By performing symbol level interleaving operations, throughput and reliability may be increased.

Figure 15:
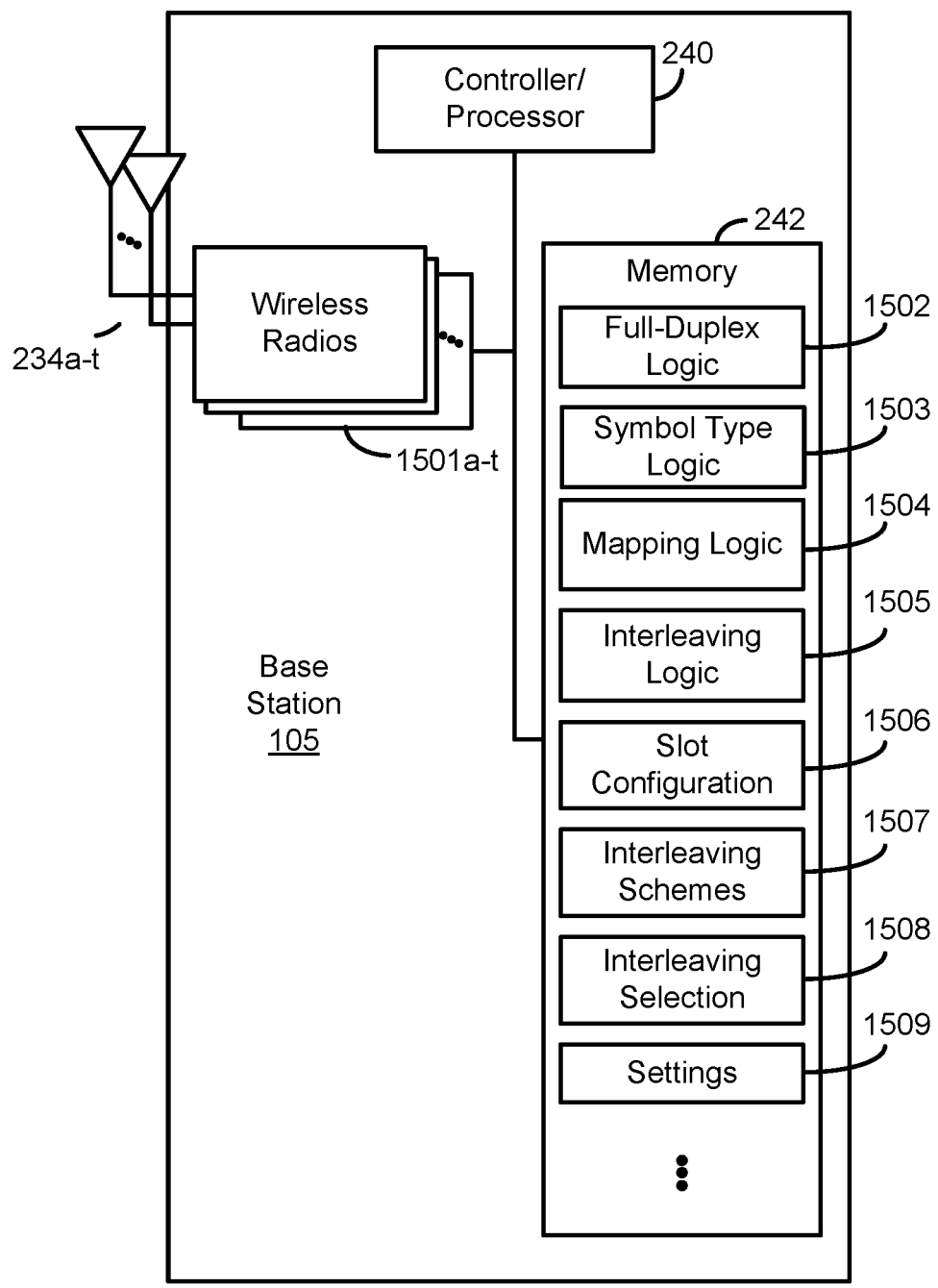
FIG. 15 is a block diagram conceptually illustrating a design of a base station configured to perform precoding information update operations according to some embodiments of the present disclosure.

FIG. 11 is a flow diagram illustrating example blocks executed by wireless communication device configured according to another aspect of the present disclosure. The example blocks will also be described with respect to base station 105 (e.g., gNB) as illustrated in FIG. 15. FIG. 15 is a block diagram illustrating base station 105 configured according to one aspect of the present disclosure. Base station 105 includes the structure, hardware, and components as illustrated for base station 105 of FIG. 2. For example, base station 105 includes controller/processor 240, which operates to execute logic or computer instructions stored in memory 242, as well as controlling the components of base station 105 that provide the features and functionality of base station 105. Base station 105, under control of controller/processor 240, transmits and receives signals via wireless radios 1501a-t and antennas 234a-t. Wireless radios 1501a-t includes various components and hardware, as illustrated in FIG. 2 for base station 105, including modulator/demodulators 232a-t, MIMO detector 236, receive processor 238, transmit processor 220, and TX MIMO processor 230. As illustrated in the example of FIG. 15, memory 242 stores full-duplex logic 1502, symbol type logic 1503, mapping logic 1504, interleaving logic 1505, slot configuration data 1506, interleaving schemes data 1507, interleaving selection data, 1508, and settings data 1509. One of more of 1502-1509 may include or correspond to one of 1402-1409.

At block 1100, a wireless communication device, such as a base station, determines one or more full-duplex symbols of a slot and one or more half-duplex symbols of the slot. For example, the base station 105 determines a slot configuration and symbol types thereof, as described with reference to FIGS. 4-6.

At block 1101, the base station 105 determines to use a first type of interleaving for the one or more full-duplex symbols and a second type of interleaving for the one or more half-duplex symbols. For example, the base station 105 determines a particular type of interleaving for each symbol type based on the slot configuration and/or symbol types thereof, as described with reference to FIGS. 4-6.

At block 1102, the base station 105 frequency domain maps virtual resources of the slot to physical resources of the slot based on the first type of interleaving and the second type of interleaving. For example, the base station 105 allocates physical resources for the virtual resources of the slot based on the first and second types of interleaving, as described with reference to FIGS. 4-6 and 9A-9E.

At block 1103, the base station 105 communicates based on the physical resources. For example, the base station 105 transmits and/or receives data based on the first and second types of interleaving, as described with reference to FIGS. 4-6.

The base station 105 may execute additional blocks (or the base station 105 may be configured further perform additional operations) in other implementations. For example, the base station 105 may perform one or more operations described above. As another example, the base station may perform one or more aspects as described below.

In a first aspect, the generating the uplink transmission includes: frequency domain mapping virtual resources of a slot to physical resources of the slot based on the full-duplex symbol interleaving.

In a second aspect, alone or in combination with the first aspect, the apparatus is further configured to receive a physical downlink control channel (PDCCH) scheduling a slot prior to generating the uplink transmission based on the full-duplex symbol interleaving; and to determine whether the UE has UL data to send for the particular UL grant of the slot, wherein the uplink transmission is generated further based on the PDCCH and whether the UE has UL data to send.

In a third aspect, alone or in combination with the second aspect, the apparatus is further configured to receive a downlink data transmission during the particular UL grant based on the PDCCH; and to process the downlink data transmission based on the full-duplex symbol interleaving.

In a fourth aspect, alone or in combination with the third aspect, the apparatus is further configured to determine that the UE does not have uplink data for a second particular UL grant of the UL grants associated with the configured grant; to receive a second PDCCH scheduling a second slot, the second slot including the second particular UL grant; to receive a second downlink data transmission during the second particular UL grant based on the second PDCCH; and to process the second downlink data transmission based on the full-duplex symbol interleaving.

In a fifth aspect, alone or in combination with one or more of the first aspect through the fourth aspect, the apparatus is further configured to receive a downlink transmission; and to process the downlink transmission using half-duplex symbol interleaving.

In a sixth aspect, alone or in combination with one or more of the first aspect through the fifth aspect, the apparatus is further configured to generate a second uplink transmission using half-duplex symbol interleaving; and to transmit the second uplink transmission.

In a seventh aspect, alone or in combination with one or more of the first aspect through the sixth aspect, the full-duplex interleaving includes no interleaving, legacy interleaving on each virtual resource block (VRB) segment, new interleaving on each VRB segment, joint interleaving over a bandwidth part (BWP), or legacy allocation for a resource indicator value (RIV).

In an eighth aspect, alone or in combination with one or more of the first aspect through the seventh aspect, the apparatus, prior to determining to use the full-duplex symbol interleaving for each UL grant associated with the configured grant, is further configured to transmit a capabilities message indicating that the UE is configured for symbol level interleaving.

In a ninth aspect, alone or in combination with one or more of the first aspect through the eighth aspect, the apparatus, prior to determining to use the full-duplex symbol interleaving for each UL grant associated with the configured grant, is further configured to transmit a capabilities message indicating that the UE is a symbol level interleaving capable UE.

In a tenth aspect, alone or in combination with one or more of the first aspect through the ninth aspect, the apparatus, prior to determining to use the full-duplex symbol interleaving for each UL grant associated with the configured grant, is further configured to receive a configuration message from a networking entity indicating a symbol level interleaving mode.

In an eleventh aspect, alone or in combination with one or more of the first aspect through the tenth aspect, a full-duplex mode of the slot is an in-band full duplex (IBFD) mode.

In a twelfth aspect, alone or in combination with one or more of the first aspect through the eleventh aspect, a full-duplex mode of the slot is sub-band frequency division duplex (FDD).

Figures 12, 13:
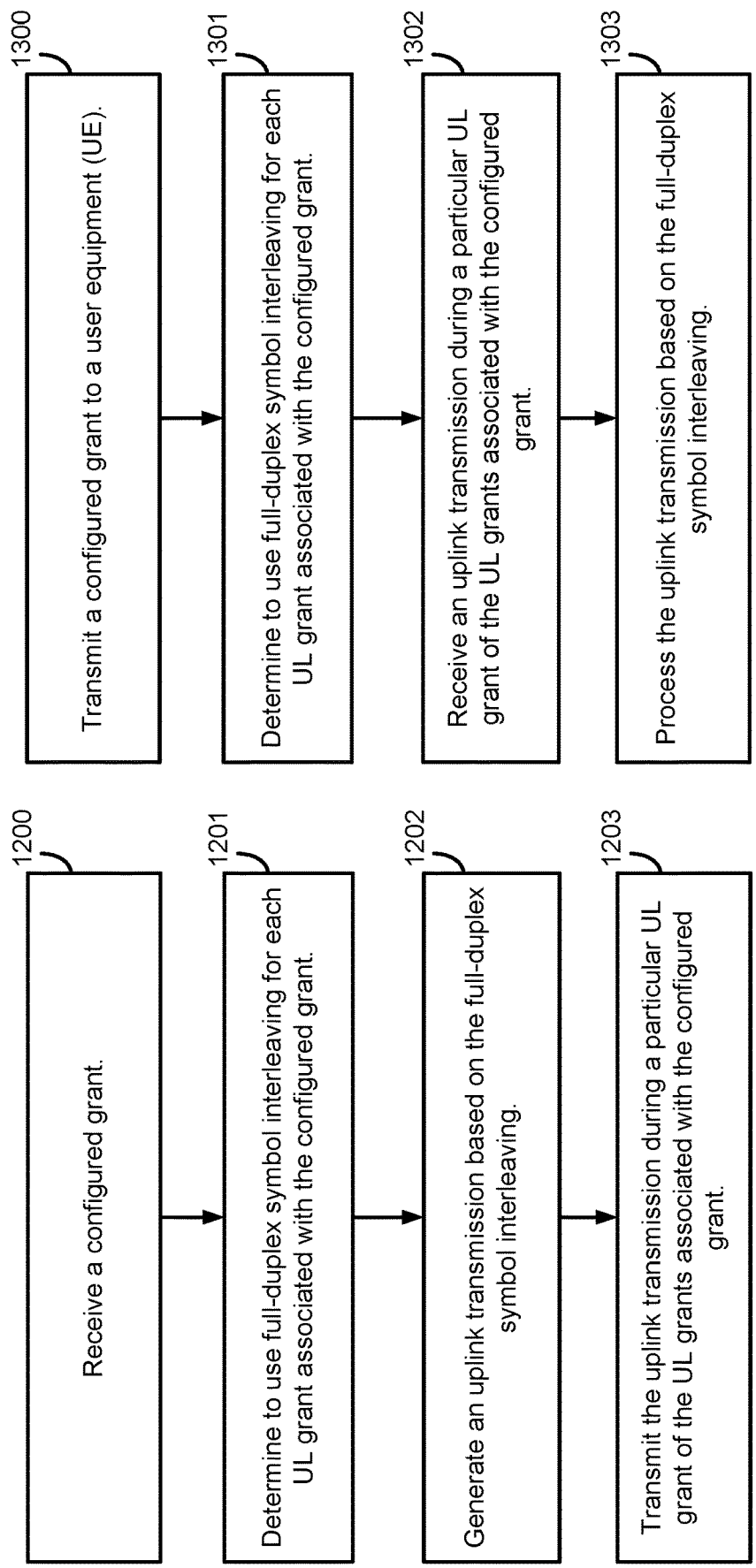
FIG. 12 is a flow diagram illustrating example blocks executed by a UE configured according to another aspect of the present disclosure.
FIG. 13 is a flow diagram illustrating example blocks executed by a base station configured according to another aspect of the present disclosure.

FIG. 12 is a flow diagram illustrating another example of blocks executed by wireless communication device configured according to another aspect of the present disclosure. The example blocks will also be described with respect to UE 115 as illustrated in FIG. 14, which was described above.

At block 1200, a wireless communication device, such as a UE, receives a configured grant. For example, the UE 115 receives a CG transmission, as described with reference to FIGS. 4 and 6.

At block 1201, the UE 115 determines to use full-duplex symbol interleaving for each UL grant associated with the configured grant. For example, the UE 115 assumes to use full-duplex interleaving or a particular type of full-duplex interleaving based on the receiving node (e.g., TRP and/or base station) not being able to determine whether the UE will actually be sending data and whether the symbols will actually be full-duplex, as described with reference to FIGS. 4 and 6.

At block 1202, the UE 115 generates an uplink transmission based on the full-duplex symbol interleaving. For example, the UE 115 performed frequency domain mapping/interleaving to generate physical resource blocks based on virtual resource blocks, as described with reference to FIGS. 4-6 and 9A-9E.

At block 1203, the UE 115 transmits the uplink transmission during a particular UL grant of the UL grants associated with the configured grant. For example, the UE 115 transmits an uplink data transmission, as described with reference to FIGS. 4 and 6.

The UE 115 may execute additional blocks (or the UE 115 may be configured further perform additional operations) in other implementations. For example, the UE 115 may perform one or more operations described above. As another example, the UE 115 may perform one or more aspects as described below or with reference to FIG. 10.

In a first aspect, the apparatus is further configured to transmit a physical downlink control channel (PDCCH) scheduling the slot, the PDCCH indicating a configuration of the slot.

In a second aspect, alone or in combination with the first aspect, the apparatus is further configured to receive a physical uplink control channel (PUCCH) scheduling uplink data for the slot; and to determine a configuration of the slot based on the PUCCH, wherein determining the one or more full-duplex symbols and the one or more half-duplex symbols is based on the configuration.

In a third aspect, alone or in combination with one or more of the first aspect through the second aspect, the communicating based on the physical resources includes: transmitting downlink data based on the first type of interleaving for the one or more full-duplex symbols; and receiving uplink data based on the first type of interleaving for the one or more full-duplex symbols.

In a fourth aspect, alone or in combination with the third aspect, communicating based on the physical resources includes: transmitting downlink data based on the second type of interleaving for the one or more half-duplex symbols; and receiving uplink data based on the second type of interleaving for the one or more half-duplex symbols.

In a fifth aspect, alone or in combination with one or more of the first aspect through the fourth aspect, the first type of interleaving and the second type of interleaving are the same.

In a sixth aspect, alone or in combination with one or more of the first aspect through the fifth aspect, the first type of interleaving and the second type of interleaving are different.

In a seventh aspect, alone or in combination with one or more of the first aspect through the sixth aspect, the interleaving types include no interleaving, legacy interleaving on each virtual resource block (VRB) segment, new interleaving on each VRB segment, joint interleaving over a bandwidth part (BWP), or legacy allocation for a resource indicator value (RIV).

In an eighth aspect, alone or in combination with one or more of the first aspect through the seventh aspect, the frequency domain mapping includes: interleaving a first virtual resource block (VRB) segment to generate a first interleaved physical resource block (PRB) segment; interleaving a second VRB segment to generate a second interleaved PRB segment; and assigning the first interleaved PRB segment and the second interleaved PRB segment physical resources.

In a ninth aspect, alone or in combination with one or more of the first aspect through the eighth aspect, the frequency domain mapping includes: joining a first virtual resource block (VRB) segment and a second a first VRB segment to generate a joined VRB segment; interleaving the joined VRB segment to generate an interleaved joined physical resource block (PRB) segment; splitting the interleaved joined PRB segment into a first PRB segment and second PRB segment; and assigning the first PRB segment and the second PRB segment physical resources.

In a tenth aspect, alone or in combination with one or more of the first aspect through the ninth aspect, the frequency domain mapping includes: interleaving a bandwidth part (BWP) to generate an interleaved BWP; and assigning the interleaved BWP physical resources.

In an eleventh aspect, alone or in combination with one or more of the first aspect through the tenth aspect, the assigned physical resources are contiguous or non-contiguous.

In a twelfth aspect, alone or in combination with one or more of the first aspect through the eleventh aspect, resources of the BWP each have a priority, and at least two resources of the BWP overlap each other and are overlapping resources, and a lower priority resource of the overlapping resources is rate matched.

In a thirteenth aspect, alone or in combination with one or more of the first aspect through the twelfth aspect, resources of the BWP each have a priority, and at least two resources of the BWP overlap each other and are overlapping resources, and a lower priority resource of the overlapping resources is moved by cyclic repetition.

In a fourteenth aspect, alone or in combination with one or more of the first aspect through the thirteenth aspect, the network entity is configured to perform a particular type of full-duplex interleaving from a set of types of full-duplex interleaving.

In a fifteenth aspect, alone or in combination with one or more of the first aspect through the fourteenth aspect, the apparatus is further configured to select a particular type of full-duplex interleaving from a set of types of full-duplex interleaving; and to select a particular type of half-duplex interleaving from a set of types of half-duplex interleaving.

In a sixteenth aspect, alone or in combination with one or more of the first aspect through the fifteenth aspect, the set of types of full-duplex interleaving includes no interleaving, legacy interleaving on each virtual resource block (VRB) segment, new interleaving on each VRB segment, joint interleaving over a bandwidth part (BWP), or legacy allocation for a resource indicator value (RIV).

In a seventeenth aspect, alone or in combination with one or more of the first aspect through the sixteenth aspect, the apparatus is further configured to transmit a radio resource control (RRC) message indicating one or more interleaving configurations.

In an eighteenth aspect, alone or in combination with one or more of the first aspect through the seventeenth aspect, the apparatus is further configured to determine if the full-duplex symbol is downlink/downlink (DL/DL) or downlink/uplink (DL/UL); and based on the determining, to select a particular type of full-duplex interleaving from a set of types of full-duplex interleaving.

In a nineteenth aspect, alone or in combination with one or more of the first aspect through the eighteenth aspect, a particular interleaving configuration within a set of interleaving configurations can be dynamically indicated via a scheduling downlink control information (DCI) or a via a control message, wherein the control message is a medium access control control element (MAC-CE) or radio resource control (RRC) configuration message.

In a twentieth aspect, alone or in combination with one or more of the first aspect through the nineteenth aspect, the apparatus, prior to determining the one or more full-duplex symbols of the slot, is further configured to receive a capabilities message indicating that a UE is configured for symbol level interleaving.

In a twenty-first aspect, alone or in combination with one or more of the first aspect through the twentieth aspect, the apparatus, prior to determining the one or more full-duplex symbols of the slot, is further configured to receive a capabilities message indicating that a UE is a symbol level interleaving capable UE.

In a twenty-second aspect, alone or in combination with one or more of the first aspect through the twenty-first aspect, the apparatus, prior to determining the one or more full-duplex symbols of the slot, is further configured to transmit a configuration message indicating a symbol level interleaving mode.

Accordingly, a UE and a base station may perform symbol level interleaving. By performing symbol level interleaving, throughput and reliability may be increased.

FIG. 13 is a flow diagram illustrating another example of blocks executed by wireless communication device configured according to another aspect of the present disclosure. The example blocks will also be described with respect to base station 105 (e.g., gNB) as illustrated in FIG. 15, which was described above.

At block 1300, a wireless communication device, such as a base station, transmits a configured grant to a user equipment (UE). For example, the base station 105 transmits a first CG transmission, as described with reference to FIGS. 4 and 6.

At block 3101, the base station 105 determines to use full-duplex symbol interleaving for each UL grant associated with the configured grant. For example, the base station 105 assumes to use full-duplex interleaving or a particular type of full-duplex interleaving based on not being able to determine whether the UE will actually be sending data and whether the symbols will actually be full-duplex.

At block 1302, the base station 105 receives an uplink transmission during a particular UL grant of the UL grants associated with the configured grant. For example, the base station 105 receives an uplink data transmission, as described with reference to FIGS. 4-6.

At block 1303, the base station 105 processes the uplink transmission based on the full-duplex symbol interleaving. For example, the base station 105 deinterleaves or decodes the uplink data based on the full-duplex symbol interleaving scheme.

The base station 105 may execute additional blocks (or the base station 105 may be configured further perform additional operations) in other implementations. For example, the base station 105 may perform one or more operations described above. As another example, the base station 105 may perform one or more aspects as described below and with reference to FIG. 11.

In a first aspect, processing the uplink transmission includes: frequency domain mapping virtual resources of a slot to physical resources of the slot based on the full-duplex symbol interleaving.

In a second aspect, alone or in combination with the first aspect, the apparatus is further configured to transmit a physical downlink control channel (PDCCH) scheduling a slot prior to generating the uplink transmission based on the full-duplex symbol interleaving.

In a third aspect, alone or in combination with the second aspect, the apparatus is further configured to generate a downlink data transmission based on the full-duplex symbol interleaving; and to transmit the downlink data transmission during the particular UL grant based on the PDCCH.

In a fourth aspect, alone or in combination with one or more of the first aspect through the third aspect, the apparatus is further configured to transmit a second PDCCH scheduling a second slot, the second slot including a second particular UL grant; and to transmit a second downlink data transmission during the second particular UL grant based on the second PDCCH, the second downlink data transmission generated based on the full-duplex symbol interleaving, wherein the UE does not transmit uplink data during the second particular UL grant.

In a fifth aspect, alone or in combination with one or more of the first aspect through the fourth aspect, the apparatus is further configured to receive an uplink transmission; and to process the uplink transmission using half-duplex symbol interleaving.

In a sixth aspect, alone or in combination with one or more of the first aspect through the fifth aspect, the apparatus is further configured to generate a second downlink transmission using half-duplex symbol interleaving; and to transmit the second downlink transmission.

In a seventh aspect, alone or in combination with one or more of the first aspect through the sixth aspect, the full-duplex interleaving includes no interleaving, legacy interleaving on each virtual resource block (VRB) segment, new interleaving on each VRB segment, joint interleaving over a bandwidth part (BWP), or legacy allocation for a resource indicator value (RIV).

In an eighth aspect, alone or in combination with one or more of the first aspect through the seventh aspect, the apparatus, prior to determining to use the full-duplex symbol interleaving for each UL grant associated with the configured grant, is further configured to transmit a capabilities message indicating that the UE is configured for symbol level interleaving.

In a ninth aspect, alone or in combination with one or more of the first aspect through the eighth aspect, the apparatus, prior to determining to use the full-duplex symbol interleaving for each UL grant associated with the configured grant, is further configured to transmit a capabilities message indicating that the UE is a symbol level interleaving capable UE.

In a tenth aspect, alone or in combination with one or more of the first aspect through the ninth aspect, the apparatus, prior to determining to use the full-duplex symbol interleaving for each UL grant associated with the configured grant, is further configured to receive a configuration message from a networking entity indicating a symbol level interleaving mode.

In an eleventh aspect, alone or in combination with one or more of the first aspect through the tenth aspect, a full-duplex mode of the slot is an in-band full duplex (IBFD) mode.

In a twelfth aspect, alone or in combination with one or more of the first aspect through the eleventh aspect, a full-duplex mode of the slot is sub-band frequency division duplex (FDD).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The functional blocks and modules described herein (e.g., the functional blocks and modules in FIG. 2) may comprise processors, electronics devices, hardware devices, electronics components, logical circuits, memories, software codes, firmware codes, etc., or any combination thereof. In addition, features discussed herein relating to symbol level interleaving may be implemented via specialized processor circuitry, via executable instructions, and/or combinations thereof.

Those of skill would further appreciate that the various illustrative logical blocks, modules, circuits, and algorithm steps (e.g., the logical blocks in FIGS. 10-13) described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Skilled artisans will also readily recognize that the order or combination of components, methods, or interactions that are described herein are merely examples and that the components, methods, or interactions of the various aspects of the present disclosure may be combined or performed in ways other than those illustrated and described herein.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. Computer-readable storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, a connection may be properly termed a computer-readable medium. For example, if the software is transmitted from a website, server, or other remote source using a coaxial cable, fiber optic cable, twisted pair, or digital subscriber line (DSL), then the coaxial cable, fiber optic cable, twisted pair, or DSL, are included in the definition of medium. Disk and disc, as used herein, includes compact disc (CD), laser disc, optical disc, digital versatile disc (DVD), hard disk, solid state disk, and blu-ray disc where disks usually reproduce data magnetically, while discs reproduce data optically with lasers. Combinations of the above should also be included within the scope of computer-readable media.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C) or any of these in any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of wireless communication comprising:
   determining, by a user equipment (UE), one or more full-duplex symbols in a slot and one or more half-duplex symbols in the same slot;
   determining, by the UE, to use a first type of symbol level interleaving for the one or more full-duplex symbols in the slot and a second type of symbol level interleaving for the one or more half-duplex symbols in the same slot;
   frequency domain mapping, by the UE, virtual resources of the slot to physical resources of the slot based on the first type of symbol level interleaving and the second type of symbol level interleaving; and
   communicating, by the UE, based on the physical resources.

2. The method of claim 1, further comprising:
   receiving, by the UE, a physical downlink control channel (PDCCH) scheduling the slot; and
   determining, by the UE, a configuration of the slot based on configuration information of a signaling message, wherein determining the one or more full-duplex symbols and the one or more half-duplex symbols is based on the configuration.

3. The method of claim 1, further comprising:
   transmitting, by the UE, a physical uplink control channel (PUCCH) scheduling uplink data for the slot; and
   determining, by the UE, a configuration of the slot based on resource control (RRC) signaling, wherein determining the one or more full-duplex symbols and the one or more half-duplex symbols is based on the configuration.

4. The method of claim 1, wherein communicating based on the physical resources includes:
   transmitting, by the UE, uplink data based on the first type of symbol level interleaving for the one or more full-duplex symbols in the slot; and
   receiving, by the UE, downlink data based on the first type of symbol level interleaving for the one or more full-duplex symbols in the slot.

5. The method of claim 4, wherein communicating based on the physical resources further includes:
   transmitting, by the UE, uplink data based on the second type of symbol level interleaving for the one or more half-duplex symbols in the slot; and
   receiving, by the UE, downlink data based on the second type of symbol level interleaving for the one or more half-duplex symbols in the slot.

6. The method of claim 5, wherein the uplink data is transmitted to a first antenna panel and the downlink data is received from a second antenna panel, and wherein the first antenna panel and the second antenna panel correspond to a single base station or to multiple base stations.

7. The method of claim 1, wherein the first type of symbol level interleaving includes no interleaving, legacy interleaving on each virtual resource block (VRB) segment, new interleaving on each VRB segment, joint interleaving over a bandwidth part (BWP), or legacy interleaving for a resource indicator value (RIV).

8. The method of claim 2, wherein the signaling message comprises a radio resource control (RRC) message, a medium access control control element (MAC-CE), downlink control information (DCI), or the PDCCH.

9. A method of wireless communication comprising:
   receiving, by a user equipment (UE), a configured grant;
   determining, by the UE, to use full-duplex symbol level interleaving for each uplink (UL) grant associated with the configured grant;
   generating, by the UE, an uplink transmission based on the full-duplex symbol level interleaving; and
   transmitting, by the UE, the uplink transmission during a particular UL grant of the UL grants associated with the configured grant.

10. The method of claim 9, wherein generating the uplink transmission includes:
    frequency domain mapping, by the UE, virtual resources of a slot to physical resources of the slot based on the full-duplex symbol level interleaving.

11. The method of claim 9, further comprising:
    receiving, by the UE, a physical downlink control channel (PDCCH) scheduling a slot prior to generating the uplink transmission based on the full-duplex symbol level interleaving; and
    determining, by the UE, whether the UE has UL data to send for the particular UL grant of the slot, wherein the uplink transmission is generated further based on the PDCCH and whether the UE has UL data to send.

12. The method of claim 11, further comprising:
    receiving, by the UE, a downlink data transmission during the particular UL grant based on the PDCCH; and
    processing, by the UE, the downlink data transmission based on the full-duplex symbol level interleaving.

13. The method of claim 11, further comprising:
    determining, by the UE, that the UE does not have uplink data for a second particular UL grant of the UL grants associated with the configured grant;
    receiving, by the UE, a second PDCCH scheduling a second slot, the second slot including the second particular UL grant;
    receiving, by the UE, a second downlink data transmission during the second particular UL grant based on the second PDCCH; and
    processing, by the UE, the second downlink data transmission based on the full-duplex symbol level interleaving.

14. An apparatus configured for wireless communication, the apparatus comprising:
    at least one processor; and
    a memory coupled to the at least one processor,
    wherein the at least one processor is configured:
      to receive, by a user equipment (UE), a configured grant;
      to determine, by the UE, to use full-duplex symbol level interleaving for each uplink (UL) grant associated with the configured grant;
      to generate, by the UE, an uplink transmission based on the full-duplex symbol level interleaving; and
      to transmit, by the UE, the uplink transmission during a particular UL grant of the UL grants associated with the configured grant.

15. The apparatus of claim 14, wherein the at least one processor is further configured:
   to receive, by the UE, a downlink transmission; and
   to process, by the UE, the downlink transmission using half-duplex symbol level interleaving.

16. The apparatus of claim 14, wherein the at least one processor is further configured:
   to generate, by the UE, a second uplink transmission using half-duplex symbol level interleaving; and
   to transmit, by the UE, the second uplink transmission.

17. The apparatus of claim 14, wherein the full-duplex symbol level interleaving includes no interleaving, legacy interleaving on each virtual resource block (VRB) segment, new interleaving on each VRB segment, joint interleaving over a bandwidth part (BWP), or legacy interleaving for a resource indicator value (RIV).

18. An apparatus configured for wireless communication, the apparatus comprising:
   at least one processor; and
   a memory coupled to the at least one processor,
   wherein the at least one processor is configured:
      to determine, by a user equipment (UE), one or more full-duplex symbols in a slot and one or more half-duplex symbols in the same slot;
      to determine, by the UE, to use a first type of symbol level interleaving for the one or more full-duplex symbols in the slot and a second type of symbol level interleaving for the one or more half-duplex symbols in the same slot;
      to frequency domain map, by the UE, virtual resources of the slot to physical resources of the slot based on the first type of symbol level interleaving and the second type of symbol level interleaving; and
      to communicate, by the UE, based on the physical resources.

19. The apparatus of claim 18, wherein to frequency domain map includes:
   to interleave a first virtual resource block (VRB) segment to generate a first interleaved physical resource block (PRB) segment;
   to interleave a second VRB segment to generate a second interleaved PRB segment; and
   to assign the first interleaved PRB segment and the second interleaved PRB segment physical resources of the physical resources of the slot.

20. The apparatus of claim 18, wherein to frequency domain map includes:
   to join a first virtual resource block (VRB) segment and a second VRB segment to generate a joined VRB segment;
   to interleave the joined VRB segment to generate an interleaved joined physical resource block (PRB) segment;
   to split the interleaved joined PRB segment into a first PRB segment and second PRB segment; and
   to assign the first PRB segment and the second PRB segment physical resources of the physical resources of the slot.

21. The apparatus of claim 20, wherein the assigned physical resources are contiguous or non-contiguous.

22. The apparatus of claim 18, wherein the at least one processor is further configured to perform, by the UE, a particular type of full-duplex symbol level interleaving from a set of configured types of full-duplex symbol level interleaving.

23. The apparatus of claim 18, wherein the at least one processor is further configured:
   to select, by the UE, a particular type of full-duplex symbol level interleaving from a set of configured types of full-duplex symbol level interleaving as the first type of symbol level interleaving; and
   to select, by the UE, a particular type of half-duplex symbol level interleaving from a set of configured types of half-duplex symbol level interleaving as the second type of symbol level interleaving.

24. The apparatus of claim 23, wherein the set of configured types of full-duplex symbol level interleaving includes no interleaving, legacy interleaving on each virtual resource block (VRB) segment, new interleaving on each VRB segment, joint interleaving over a bandwidth part (BWP), or legacy interleaving for a resource indicator value (RIV).

25. The apparatus of claim 18, wherein the at least one processor is further configured:
   to receive, by the UE, a radio resource control (RRC) message indicating one or more interleaving configurations.

26. The apparatus of claim 18, wherein the at least one processor is further configured:
   to determine if a particular full-duplex symbol has a downlink/uplink/downlink (DL/UL/DL) configuration or downlink/uplink (DL/UL) configuration; and
   to select a particular type of full-duplex symbol level interleaving from a set of configured types of full-duplex symbol level interleaving based on the determined configuration for the particular full-duplex symbol.

27. The apparatus of claim 18, wherein a particular interleaving configuration within a set of interleaving configurations can be dynamically indicated via a scheduling downlink control information (DCI) or a via a control message, wherein the control message is a medium access control control element (MAC-CE) or a radio resource control (RRC) configuration message.

28. The apparatus of claim 18, wherein a full-duplex mode of the slot is an in-band full duplex (IBFD) mode or a sub-band frequency division duplex (SBFD) mode.

29. The apparatus of claim 18, wherein the at least one processor configured to frequency domain map the virtual resources of the slot to physical resources of the slot includes:
   to frequency domain map first virtual resources of the one or more full-duplex symbols in the slot to first physical resources of the slot based on the first type of symbol level interleaving; and
   to frequency domain map second virtual resources of the one or more half-duplex symbols in the slot to second physical resources of the slot based the second type of symbol level interleaving.

30. The apparatus of claim 18, wherein the at least one processor configured communicate based on the physical resources includes:
   to transmit uplink data based on the first type of symbol level interleaving for a first full-duplex symbol of the one or more full-duplex symbols in the slot; and
   to receive downlink data based on the first type of symbol level interleaving for the first full-duplex symbol in the slot; and
      to receive second downlink data based on the second type of symbol level interleaving for a first half-duplex symbol of the one or more half-duplex symbols in the slot.

* * * * *